(12) United States Patent
Chen et al.

(10) Patent No.: US 6,777,173 B2
(45) Date of Patent: Aug. 17, 2004

(54) H$_2$O VAPOR AS A PROCESSING GAS FOR CRUST, RESIST, AND RESIDUE REMOVAL FOR POST ION IMPLANT RESIST STRIP

(75) Inventors: Anthony Chen, Pleasanton, CA (US); Gladys So-Wan Lo, Fremont, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 10/232,635

(22) Filed: Aug. 30, 2002

(65) Prior Publication Data

US 2004/0043337 A1 Mar. 4, 2004

(51) Int. Cl.$^7$ .............................. G03F 7/40; G03F 7/42; C03C 15/00; C23F 1/00; B44C 1/22
(52) U.S. Cl. ........................ 430/329; 134/1.1; 134/1.2; 134/1.3; 216/67
(58) Field of Search ............................ 134/1.1, 1.2, 1.3; 430/329; 216/67

(56) References Cited

U.S. PATENT DOCUMENTS

| | | | |
|---|---|---|---|
| 4,861,424 A | * 8/1989 | Fujimura et al. | 134/1 |
| 4,961,820 A | * 10/1990 | Shinagawa et al. | 156/643 |
| 5,773,201 A | * 6/1998 | Fujimura et al. | 430/329 |
| 5,811,358 A | * 9/1998 | Tseng et al. | 430/329 |
| 6,232,237 B1 | * 5/2001 | Tamaoka et al. | 430/329 |
| 6,372,150 B1 | * 4/2002 | Wong et al. | 216/67 |
| 6,431,182 B1 | * 8/2002 | Rakhshandehroo et al. | 134/1.2 |
| 6,435,196 B1 | * 8/2002 | Satoh et al. | 134/1.1 |
| 2002/0197870 A1 | * 12/2002 | Johnson | 438/689 |
| 2003/0104320 A1 | * 6/2003 | Nguyen et al. | 430/329 |

* cited by examiner

Primary Examiner—Richard L. Schilling
(74) Attorney, Agent, or Firm—Martine & Penilla, LLP

(57) ABSTRACT

H$_2$O vapor is used as a processing gas for stripping photoresist material from a substrate having a patterned photoresist layer previously used as an ion implantation mask, wherein the patterned photoresist layer is defined by a photoresist crust covering a bulk photoresist portion. Broadly speaking, the H$_2$O vapor is demonstrated to more efficiently strip the photoresist material having a cross-linked photoresist crust without causing the photoresist crust to pop and without causing the bulk photoresist to be undercut. Thus, H$_2$O vapor provides a safe, efficient, and economical processing gas for stripping photoresist material having a photoresist crust resulting from an ion implantation process.

25 Claims, 16 Drawing Sheets

H₂O VAPOR AS A PROCESSING GAS FOR CRUST, RESIST, AND RESIDUE REMOVAL FOR POST ION IMPLANT RESIST STRIP

BACKGROUND OF THE INVENTION

1. Field of the Invention

The present invention relates generally to semiconductor fabrication, and more particularly, to methods and apparatuses for using $H_2O$ vapor as a processing gas for stripping photoresist material from a substrate having a patterned photoresist layer previously used as an ion implantation mask.

2. Description of the Related Art

During semiconductor fabrication, integrated circuits are created on a semiconductor wafer ("wafer") composed of a material such as silicon. To create the integrated circuits on the wafer, it is necessary to fabricate a large number (e.g., millions) of electronic devices such as resistors, diodes, capacitors, and transistors of various types. Fabrication of the electronic devices involves depositing, removing, and implanting materials at precise locations on the wafer. A process called photolithography is commonly used to facilitate deposition, removal, and implantation of materials at precise locations on the wafer.

In the photolithography process, a photoresist material is first deposited onto the wafer. The photoresist material is then exposed to light filtered by a reticle. The reticle is generally a glass plate that is patterned with exemplary feature geometries that block light from passing through the reticle. After passing through the reticle, the light contacts the surface of the photoresist material. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After the exposure to the light, the soluble portions of the photoresist material are removed, leaving a patterned photoresist layer.

The wafer is then processed to either deposit, remove, or implant materials in the wafer regions not covered by the patterned photoresist layer. After the wafer processing, the patterned photoresist layer is removed from the wafer in a process called photoresist stripping. It is important to completely remove the photoresist material during the photoresist stripping process because photoresist material remaining on the wafer surface may cause defects in the integrated circuits. Also, the photoresist stripping process should be performed carefully to avoid damaging the electronic devices present on the wafer.

As with many other wafer fabrication processes, an ion implantation process utilizes photolithography to protect specific areas of the wafer where ion implantation is not desirable. The ion implantation process, however, introduces difficulty in removing the photoresist material during the subsequent photoresist stripping process. Specifically, during the ion implantation process, ions penetrate into the outer regions of the photoresist material causing chemical bonds in the photoresist material outer regions to become cross-linked. Thus, the cross-linked outer regions of the photoresist material form a photoresist crust which is difficult to remove during the photoresist stripping process.

FIG. 1A is an illustration showing a cross-section of a patterned photoresist layer previously used as an ion implantation mask, in accordance with the prior art. During the ion implantation process, ions 131 are implanted into target regions 129 of a substrate material 121, where the target regions 129 are not protected by the photoresist material. Ions 131 entering the photoresist material cause the chemical bonds in the photoresist material to become cross-linked. Since the ions 131 only penetrate a limited distance through the photoresist material, the cross-linked photoresist is found near the outer portions of the photoresist material. The cross-linked photoresist is commonly called photoresist crust. The photoresist crust is typically characterized by a top photoresist crust 125 and a side photoresist crust 127. The thickness of the photoresist crust is generally dependent on the dosage of implant species and the ion implant energy in the photoresist material. Since the ions generally bombard the photoresist material in a downward direction, the top photoresist crust 125 is generally thicker than the side photoresist crust 127. The unaffected photoresist material underneath the photoresist crust is referred to as a bulk photoresist material 123.

Generally, the stripping process for photoresist materials used in wafer fabrication processes other than ion implantation involves heating the photoresist material to a sufficiently high temperature to cause the photoresist material to be removed through volatilization. This high temperature photoresist stripping process is commonly called ashing. Ashing, however, is not appropriate for stripping photoresist material that has been used as an ion implantation mask. Specifically, the photoresist crust is resistant to the ashing process. As the temperature increases, the pressure of the volatile bulk photoresist portion underneath the photoresist crust increases. Eventually, at high enough temperature, the bulk photoresist portion will "pop" through the photoresist crust. Such "popping" causes fragments of the photoresist crust to be spread over the wafer and the chamber. The photoresist crust fragments adhere tenaciously to the wafer. Thus, removal of the photoresist crust fragments from the wafer can be difficult if not impossible. Furthermore, the ion implantation process often uses elements such as arsenic which can present a serious hazard when contained in photoresist crust fragments being cleaned from the chamber. Therefore, removal of the photoresist crust is generally performed at a low enough temperature to prevent popping.

FIG. 1B is an illustration showing the problem wherein the bulk photoresist portion pops through the top photoresist crust, in accordance with the prior art. The bulk photoresist portion 123 is shown popping through the top photoresist crust 125 at a location 141. The resulting top photoresist fragments 143 are shown adhering to the substrate material 121.

Stripping of the photoresist crust at low temperature is typically performed by exposing the photoresist crust to radicals formed from various processing gases such as $O_2:N_2H_2$, $O_2:N_2:CF_4$, $NH_3$, $O_2$, $O_2:CF_4$, and $O_2:Cl_2$, where ":" denotes a gas mixture. The radicals serve to break the cross-linked chemical bonds of the photoresist crust, thus allowing the photoresist crust to be removed. Photoresist stripping using these processing gases at low temperature typically requires an extended amount of time, thus reducing wafer throughput. Also, handling some of these processing gases such as $N_2H_2$, $NH_3$, and $Cl_2$ generally involves special requirements and safety features which can increase the capital cost of the wafer processing equipment. Furthermore, photoresist stripping using these processing gases commonly results in a problem wherein the side photoresist crust is removed before the top photoresist crust, thus allowing the bulk photoresist portion to be removed from underneath the top photoresist crust. This problem is commonly called "bulk photoresist undercut".

FIG. 1C is an illustration showing the undercut problem wherein the side photoresist crust is removed allowing the bulk photoresist to be undercut, in accordance with the prior art. The side photoresist crust (not shown) is removed prior to the top photoresist crust 127. Removal of the side photoresist crust causes the bulk photoresist portion 123 to be exposed to the radicals. Exposure of the bulk photoresist portion 123 to the radicals along with the volatile nature of the bulk photoresist portion 123 causes an undercut 151 region to be created. The undercut region 151 leaves the top photoresist crust 127 susceptible to breaking off or falling onto the substrate material 121. If allowed to contact the substrate material 121, the top photoresist crust 127 will adhere tenaciously causing its removal to be difficult if not impossible.

In view of the foregoing, there is a need for a method and an apparatus for stripping photoresist material that has been used as an ion implantation mask. Specifically, the method and apparatus should avoid the problems of the prior art by using a processing gas that can more efficiently and economically strip the photoresist material while preventing popping and undercut of the bulk photoresist.

SUMMARY OF THE INVENTION

Broadly speaking, the present invention fills these needs by providing an apparatus and method for using $H_2O$ vapor as a processing gas for stripping photoresist material from a substrate having a patterned photoresist layer previously used as an ion implantation mask. The patterned photoresist layer is characterized by a photoresist crust covering a bulk photoresist portion. It should be appreciated that the present invention can be implemented in numerous ways, including as a process, an apparatus, a system, a device, or a method. Several embodiments of the present invention are described below.

In one embodiment, a method for stripping photoresist material from a substrate in a chamber is disclosed. The method includes providing a substrate having a patterned photoresist layer that has previously been used as an ion implantation mask. The previous use of the patterned photoresist layer in an ion implantation process formed a photoresist crust on an outer surface of the patterned photoresist layer. Thus, the patterned photoresist layer is defined by a bulk photoresist portion and the photoresist crust. In accordance with the method, the substrate is placed in the chamber and heated in the chamber. The method further includes providing $H_2O$ vapor to be transformed into a reactive form of H and a reactive form of O. The reactive forms of H and O react with the photoresist crust to remove the photoresist crust from the bulk photoresist portion of the patterned photoresist layer.

In another embodiment, a method for stripping photoresist material from a substrate in a chamber is disclosed. The substrate has a patterned photoresist layer that has been previously used as an ion implantation mask such that a photoresist crust is formed on an outer surface of the patterned photoresist layer. Thus, the patterned photoresist layer is defined by a bulk photoresist portion and the photoresist crust. The substrate is placed on a chuck in the chamber. The method includes providing $H_2O$ vapor to an applicator tube and applying microwave power to the $H_2O$ vapor in the applicator tube. The $H_2O$ vapor is transformed into H radicals and O radicals. The method further includes flowing the H radicals and the O radicals from the applicator tube to the substrate. Upon reaching the substrate, the H radicals and the O radicals react with the photoresist crust to remove the photoresist crust from the bulk photoresist portion of the patterned photoresist layer.

In another embodiment, a method for stripping photoresist material from a substrate in a chamber is disclosed. The substrate has a patterned photoresist layer that has been previously used as an ion implantation mask such that a photoresist crust is formed on an outer surface of the patterned photoresist layer. Thus, the patterned photoresist layer is defined by a bulk photoresist portion and the photoresist crust. The substrate is placed on a chuck in the chamber. The method includes providing $H_2O$ vapor to the chamber. In accordance with the method, radio frequency power is applied to the $H_2O$ vapor in the chamber to transform the $H_2O$ vapor into a plasma containing H ions, H radicals, O ions, and O radicals. The method further includes applying a bias voltage to the chuck to attract the H ions and the O ions to the substrate. Upon reaching the substrate, the H ions and the O ions react with the photoresist crust to remove the photoresist crust from the bulk photoresist portion of the patterned photoresist layer.

In another embodiment, an apparatus for removing a patterned photoresist layer from a semiconductor wafer is disclosed. The apparatus includes a chamber having an internal region configured to contain a plasma. A semiconductor wafer support structure is disposed within the chamber internal region. The semiconductor wafer support structure is configured to hold a semiconductor wafer in exposure to the plasma. An $H_2O$ vapor supply line is configured to supply an $H_2O$ vapor to a plasma generation region. The apparatus further includes a power supply for generating the plasma in the plasma generation region. The plasma generation region is configured to supply the plasma to the chamber internal region.

In another embodiment, an apparatus for removing a patterned photoresist layer from a semiconductor wafer is disclosed. The apparatus includes a chamber having an internal region defined by a top, a bottom, and sides. A semiconductor wafer support structure is disposed in close proximity to the bottom of the chamber internal region. The semiconductor wafer support structure is configured to hold a semiconductor wafer having a patterned photoresist layer. The apparatus also includes an applicator tube in open communication with the top of the chamber internal region. An $H_2O$ vapor supply line is configured to supply $H_2O$ vapor to the applicator tube. The apparatus further includes a power supply configured to apply microwave power to the applicator tube. The microwave power is used to transform the $H_2O$ vapor into H radicals and O radicals. The H radicals and the O radicals flow through the chamber internal region to reach the patterned photoresist layer of the semiconductor wafer. Upon reaching the patterned photoresist layer of the semiconductor wafer, the H radicals and the O radicals react to remove at least a portion of the patterned photoresist layer.

In another embodiment, an apparatus for removing a patterned photoresist layer from a semiconductor wafer is disclosed. The apparatus includes a chamber having an internal region defined by a top, a bottom, and sides. A semiconductor wafer support structure is disposed in close proximity to the bottom of the chamber internal region. The semiconductor wafer support structure is configured to hold a semiconductor wafer having a patterned photoresist layer. The apparatus also includes an electrically conductive coil disposed above the top of the chamber internal region. An $H_2O$ vapor supply line is configured to supply $H_2O$ vapor to the chamber internal region. The apparatus includes a first power supply configured to supply radio frequency power to the coil. The radio frequency power supplied to the coil is used to induce an electric current in the chamber internal region. The induced electric current transforms the $H_2O$ vapor into H ions, H radicals, O ions, and O radicals. The apparatus further includes a second power supply configured to supply radio frequency power to the semiconductor wafer support structure. The radio frequency power supplied to the semiconductor wafer support structure causes the semiconductor wafer support structure to have a bias voltage. The bias voltage attracts the H ions and the O ions to the patterned photoresist layer of the semiconductor wafer. Upon reaching the patterned photoresist layer of the semiconductor wafer, the H ions and the O ions react to remove at least a portion of the patterned photoresist layer.

The advantages of the present invention are numerous. Most notably, the apparatus and method for using $H_2O$ vapor as a processing gas as disclosed in the present invention avoids the problems of the prior art by effectively stripping the photoresist material having the photoresist crust without causing the photoresist crust to pop or be undercut. Thus, the present invention eliminates the problems of the prior art by using $H_2O$ vapor as a safe, effective, and economical processing gas for stripping photoresist material having a photoresist crust.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1A:
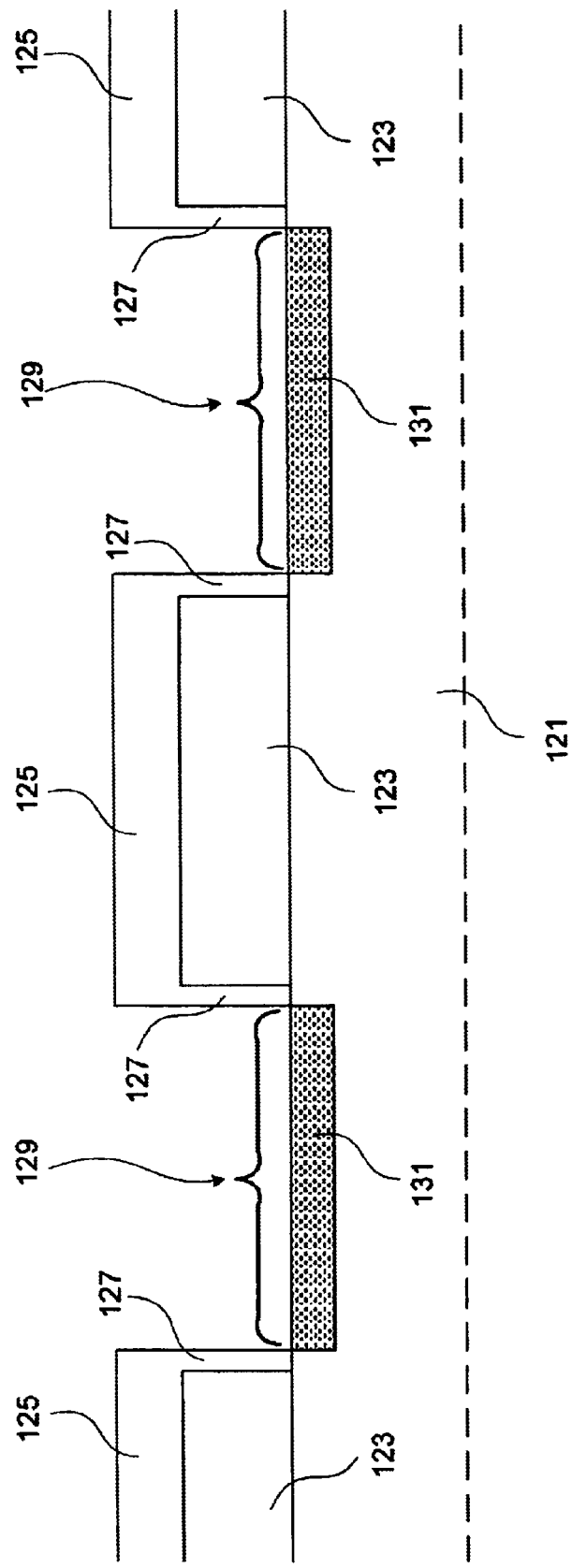
FIG. 1A is an illustration showing a cross-section of a patterned photoresist layer previously used as an ion implantation mask, in accordance with the prior art.
Figure 1B:
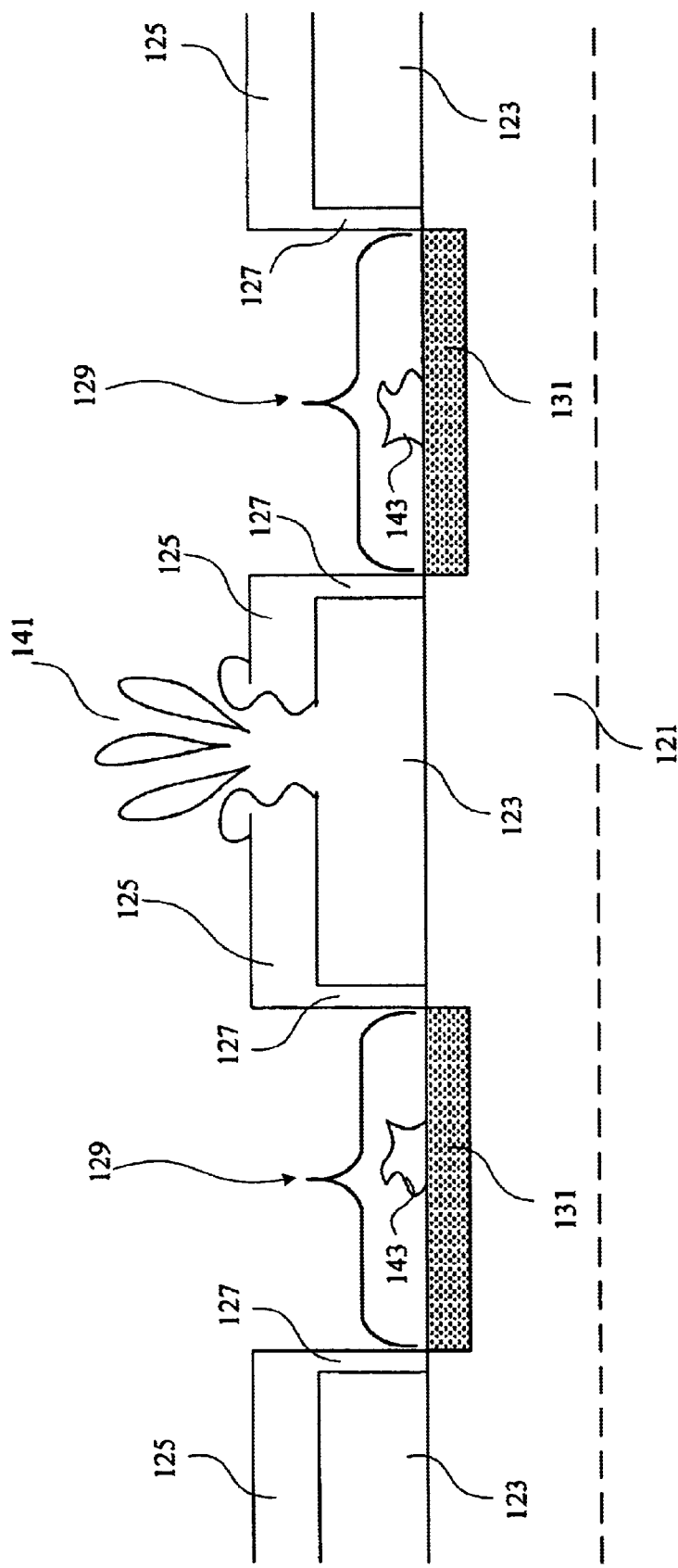
FIG. 1B is an illustration showing the problem wherein the bulk photoresist portion pops through the top photoresist crust, in accordance with the prior art.
Figure 1C:
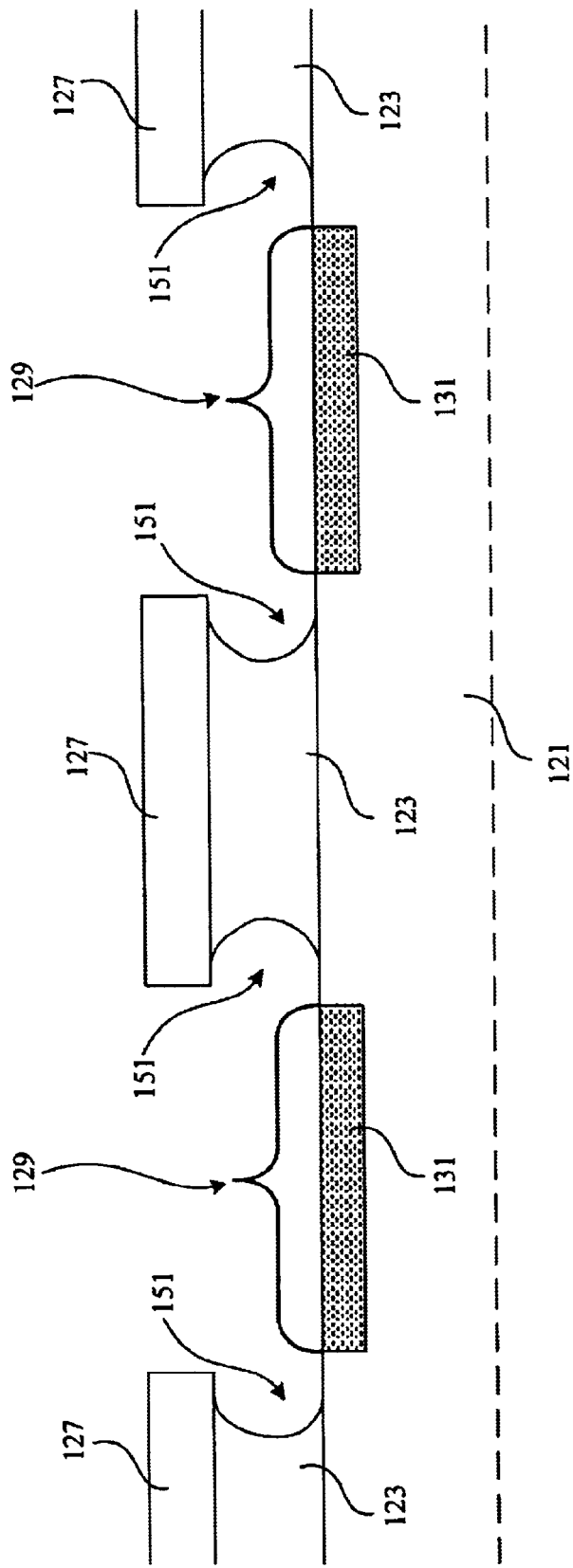
FIG. 1C is an illustration showing the undercut problem wherein the side photoresist crust is removed allowing the top photoresist crust to be undercut, in accordance with the prior art.

An invention is disclosed for methods and apparatuses for using $H_2O$ vapor as a processing gas for stripping photoresist materials from a substrate having a patterned photoresist layer previously used as an ion implantation mask. Use of the patterned photoresist layer as the ion implantation mask causes the photoresist materials to form an outer photoresist crust having cross-linked chemical bonds. The photoresist crust covers a bulk photoresist portion having normal photoresist chemical bonds. Broadly speaking, the present invention provides for using $H_2O$ vapor to efficiently strip the photoresist crust without causing the bulk photoresist portion to either pop through or be undercut from the photoresist crust. Thus, the present invention eliminates the problems of the prior art by using $H_2O$ vapor as a safe, efficient, and economical processing gas for stripping photoresist materials having photoresist crust.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

In a photolithography process to create an ion implantation mask, a photoresist material is first deposited onto a semiconductor wafer. The photoresist material is then exposed to light filtered by a reticle. The reticle is generally a glass plate that is patterned with exemplary feature geometries that block light from passing through the reticle. After passing through the reticle, the light contacts the surface of the photoresist material. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After exposure to the light, the soluble portion of the photoresist material is removed, leaving the patterned photoresist layer. An ion implantation process is then performed on the semiconductor wafer having the patterned photoresist layer. In general, the ion implantation process involves implanting ions of elements (e.g., P, B, As, etc . . . ) into the semiconductor wafer regions that are not protected by the patterned photoresist material. After the ion implantation process is completed, the patterned photoresist material must be stripped (i.e., removed) from the semiconductor wafer. Stripping of the patterned photoresist material must be performed thoroughly yet carefully to avoid damaging the semiconductor wafer.

Ion implantation introduces difficulty in removing the photoresist material during the post ion implant photoresist stripping process. Specifically, during the ion implantation process, ions penetrate into the outer regions of the photoresist material causing the chemical bonds of the photoresist material to become cross-linked (i.e., H—C—H becomes C—C—C). Thus, the cross-linked outer regions of the photoresist material forms the photoresist crust which is difficult to remove during the photoresist stripping process. The present invention provides methods and apparatuses by which $H_2O$ vapor can be used to strip the crust and corresponding bulk portion of the photoresist material used as the ion implantation mask.

Figure 2:
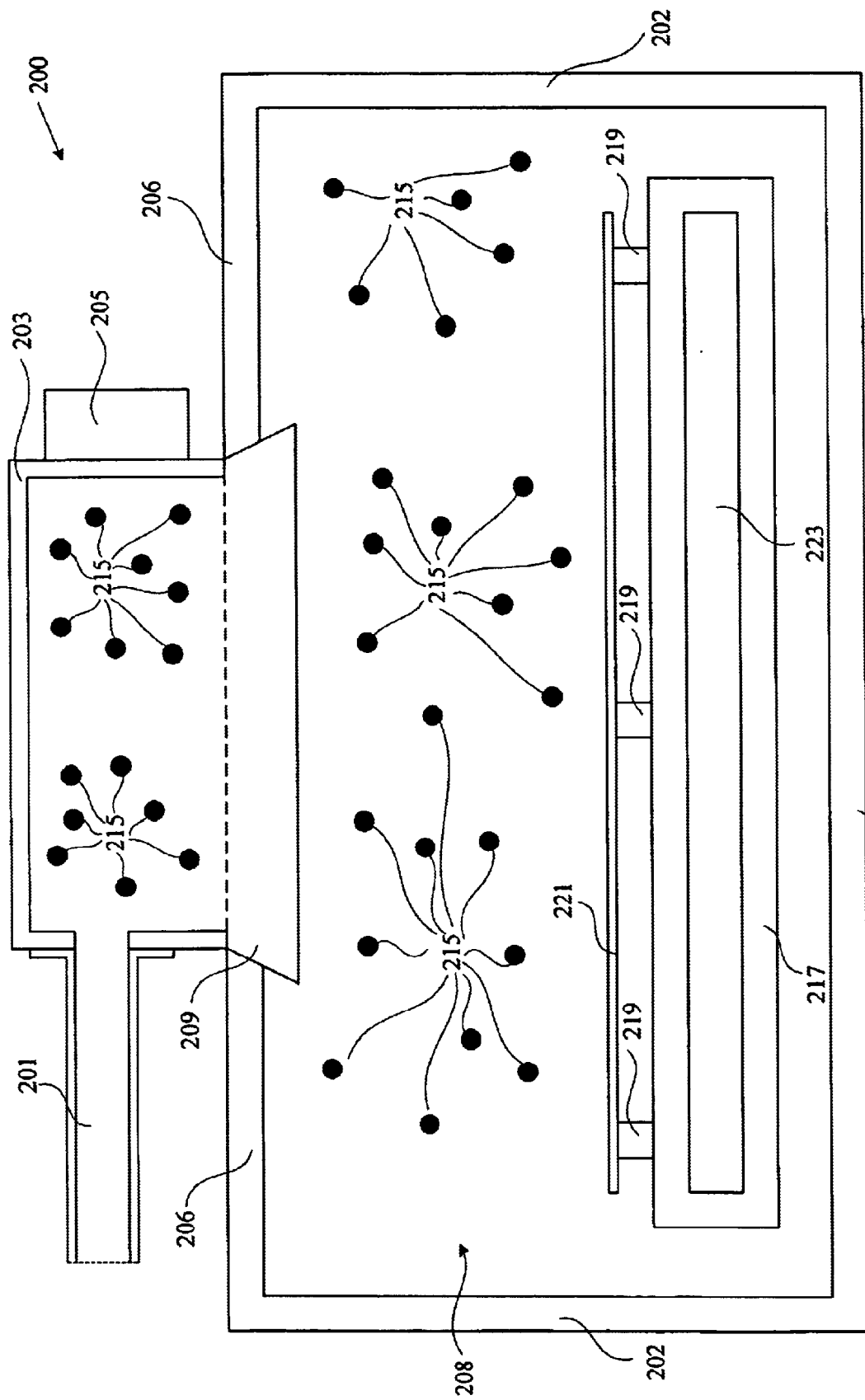
FIG. 2 is an illustration showing a downstream chamber, in accordance with one embodiment of the present invention.

FIG. 2 is an illustration showing a downstream photoresist stripping chamber ("downstream chamber") 200, in accordance with one embodiment of the present invention. The downstream chamber 200 is an apparatus that can be used to perform the post ion implant photoresist stripping process. A chamber internal region 208 is defined by chamber walls 202, a chamber bottom 204, and a chamber top 206. A semiconductor wafer support structure (or "chuck") 217 is positioned within the chamber internal region 208 near the chamber bottom 204. The chuck 217 contains a number of lifting pins 219 that are used to raise and lower a semiconductor wafer (or "wafer") 221 placed on the chuck 217 for processing. The chuck 217 also includes a heater 223 configured to operate using electric power. The downstream chamber 200 is further defined by an applicator tube 203 positioned above the chamber top 206. The applicator tube 203 is configured to be in open communication with the chamber internal region 208 via a shower head 209. A processing gas supply line 201 is in fluid communication with the applicator tube 203 to supply a processing gas. In the present invention, the preferred processing gas is either $H_2O$ vapor alone or $H_2O$ vapor in gas mixture. However, the processing gas supply line 201 can be configured to supply virtually any type of processing gas. A microwave power supply 205 is also connected to the applicator tube 203 to supply microwave power to the processing gas within the applicator tube 203. The microwave power transforms the processing gas into radicals 215 of its constituent elements. In the present invention, the radicals 215 include primarily H radicals and O radicals. The radicals 215 flow through the shower head 209 into the chamber internal region 208 toward the wafer 221. The radicals isotropically (i.e., uniformly in direction) contact the wafer 221 and react to remove materials present on the wafer 221 surface.

In a preferred embodiment of the present invention, $H_2O$ vapor is used as the processing gas in the downstream chamber 200 to strip the photoresist crust. In the preferred embodiment, a partial vacuum pressure of about 1 torr is provided in the chamber internal region 208. In alternate embodiments, the partial vacuum pressure can be provided within a range extending from about 0.5 torr to about 5 torr. Also in the preferred embodiment, $H_2O$ vapor is supplied to the applicator tube 203 at a flow rate of about 2000 standard $cm^3$ per second (std. cc/sec). In alternate embodiments, the $H_2O$ vapor can be supplied at a flow rate within a range extending from about 100 std. cc/sec to about 4000 std. cc/sec, but more preferably within a range extending from about 500 std. cc/sec to about 3000 std. cc/sec. The preferred embodiment further includes applying a microwave power of about 3 kW from the microwave power supply 205 to the $H_2O$ vapor in the applicator tube 203. In alternate embodiments, the microwave power can be applied within a range extending from about 0.5 kW to about 5 kW, but more preferably within a range extending from about 1 kW to about 4 kW. In the preferred embodiment, the chuck 217 is heated by the heater 223 to maintain the wafer 221 temperature at about 100° C. In alternate embodiments, the wafer temperature can be maintained within a range extending from about 25° C. to about 130° C., but more preferably within a range extending from about 70° C. to about 110° C. The photoresist crust stripping rate increases with higher wafer 221 temperatures. However, it is necessary to maintain the wafer 221 temperature below about 130° C. to prevent the bulk photoresist portion from popping through the photoresist crust. The wafer 221 lifting pins 219 can be either up or down during the photoresist stripping process. However, since the wafer 221 temperature is primarily controlled by heat transfer from the chuck 217, it is preferable to have the lifting pins 219 down during the photoresist stripping process, thus placing the wafer 221 in closer proximity to the chuck 217.

The usefulness of the present invention is demonstrated through a series of experiments. In the series of experiments, the post ion implant photoresist stripping effectiveness of a number of different processing gas chemistries are tested in the downstream chamber 200. The principle experimental parameters include processing gas chemistry, chamber internal region 208 pressure, microwave power, processing gas flow rate, wafer 221 temperature, and stripping process duration. Table 1 shows a summary of the principle experimental parameters for each of the tested processing gas chemistries. The experimental results are characterized in terms of photoresist crust strip rate ("crust strip rate") and bulk photoresist portion strip rate ("bulk strip rate"). Also, the ratio of the crust strip rate to the bulk strip rate is calculated to provide a measure of how much the bulk photoresist is being preferentially stripped. The ratio of the crust strip rate to the bulk strip rate is referred to as "crust selectivity." It is most desirable to have the photoresist crust and the bulk photoresist strip at equal rates (i.e., crust selectivity equal to one) to minimize bulk photoresist undercut. However, the cross-linked nature of the photoresist crust generally causes the crust selectivity to be much less than one. Nevertheless, it is necessary to have an acceptably high crust selectivity to prevent the undercut problem associated with the prior art. Table 2 shows a summary of the downstream chamber 200 experimental results corresponding to the principle experimental parameters presented in Table 1.

Figure 3:
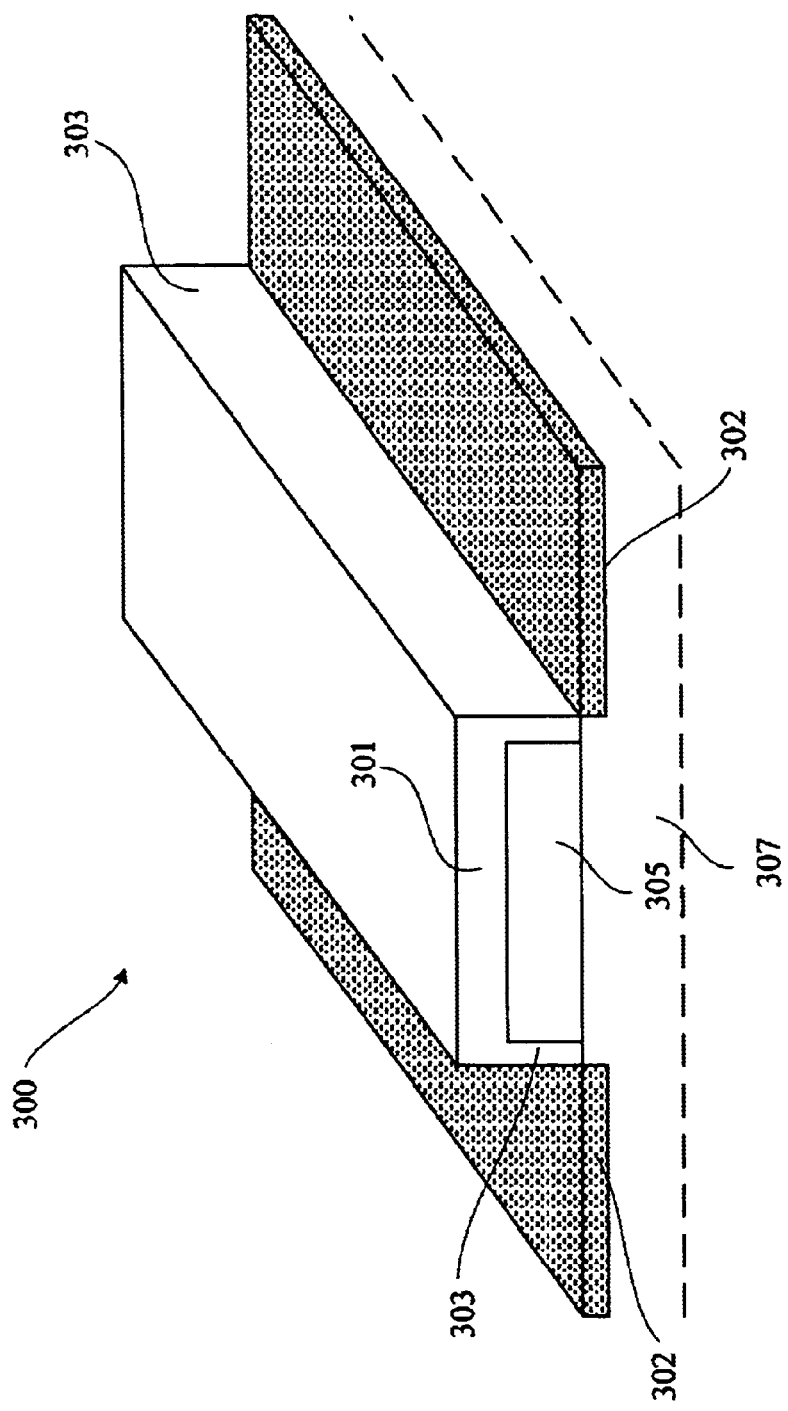
FIG. 3 is an illustration showing an exemplary cross-section of a patterned photoresist layer previously used as an ion implantation mask prior to the downstream chamber photoresist stripping experiments.

FIG. 3 is an illustration showing an exemplary cross-section 300 of a patterned photoresist layer previously used as an ion implantation mask prior to the downstream chamber 200 photoresist stripping experiments described in Table 1. The exemplary cross-section 300 includes the photoresist material disposed between ion implantation target regions containing implanted ions 302. The photoresist material is defined by a top photoresist crust 301, side photoresist crusts 303, and a bulk photoresist portion 305. The top photoresist crust 301 is thicker than the side photoresist crusts 303. The entire patterned photoresist layer is disposed on top of a substrate material 307. The substrate material 307 can be composed of many types of materials depending on the design features present at the top surface of the wafer 221. The photoresist stripping process is generally not affected by the type of substrate material 307. However, the photoresist stripping process should be carefully performed to avoid stripping or damaging the substrate material 307.

TABLE 1

Summary of Principle Parameters for the Downstream Stripping Chamber Experiments

| Processing Gas Chemistry | Chamber Internal Pressure (torr) | Micro-wave Power (kW) | Processing Gas Flow Rate (std. cc/sec) | Wafer Temperature (° C.) | Stripping Process Duration (sec) |
|---|---|---|---|---|---|
| $O_2:N_2H_2$ | 1 | 3 | 4500 $O_2$ 500 $N_2H_2$ | 100 | 120 |
| $O_2:N_2:CF_4$ | 1 | 3 | 4500 $O_2$ 500 $N_2$ 10 $CF_4$ | 120 | 120 |
| $NH_3$ | 1 | 3 | 1000 $NH_3$ | 100 | 120 |
| $H_2O$ | 1 | 3 | 2000 $H_2O$ | 80 | 120 |

TABLE 2

Summary of Results for the Downstream Stripping Chamber Experiments

| Processing Gas Chemistry | Photoresist Profile Description After Stripping | Crust Strip Rate (Å/min.) | Bulk Strip Rate (Å/min.) | Crust Selectivity |
|---|---|---|---|---|
| $O_2:N_2H_2$ | Top crust remaining; Side crust gone; Bulk photoresist undercut | 250 | 3000 | 0.08 |
| $O_2:N_2:CF_4$ | Top crust remaining; Side crust gone; Bulk photoresist severely undercut | 300 | 16000 | 0.02 |
| $NH_3$ | Top crust thinned; Side crust gone; Very little bulk photoresist undercut | 563 | 1850 | 0.30 |
| $H_2O$ | Top crust gone; Side crust gone; No sign of bulk photoresist undercut | 750 | 3750 | 0.20 |

As shown in Table 1, a downstream chamber 200 experiment is performed using an $O_2:N_2H_2$ processing gas mixture. Specifically, the processing gas mixture is composed of $O_2$ and $N_2H_2$ mixed in a 9-to-1 ratio, respectively, wherein the $N_2H_2$ contains 4% by weight $H_2$. Use of the $O_2:N_2H_2$ processing gas mixture for performing a low temperature photoresist stripping process is commonly known to those skilled in the art. One problem associated with the $O_2:N_2H_2$ processing gas is that it takes an unacceptably long time (e.g., about 4 to 5 minutes) to completely strip a typical photoresist crust thickness. Table 1 shows that of the four processing gas chemistries tested, $O_2:N_2H_2$ has the lowest crust strip rate at 250 Å/min. Also, the $O_2:N_2H_2$ processing gas has an unacceptably low crust selectivity of 0.08.

Figure 4:
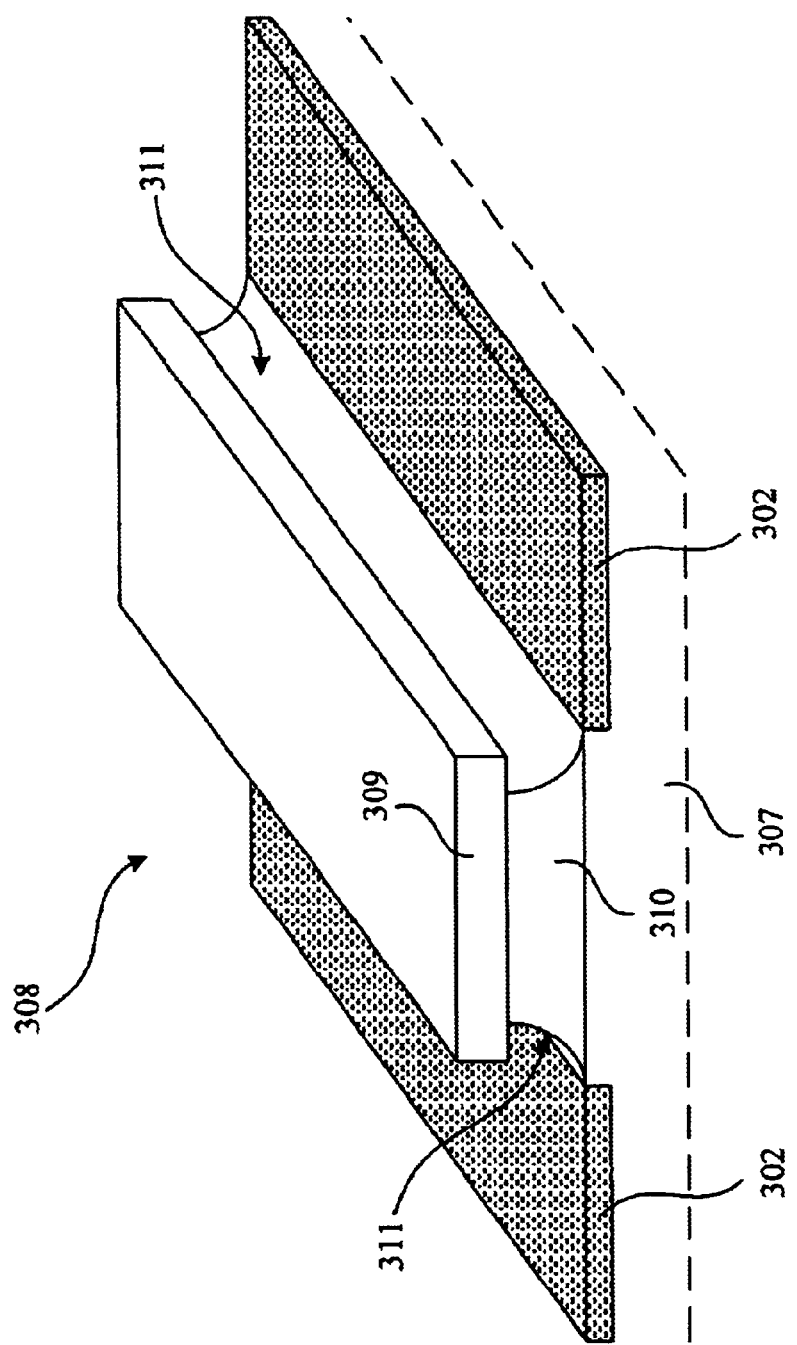
FIG. 4 is an illustration showing the photoresist stripping effect corresponding to the experiment using $O_2:N_2H_2$ as the processing gas in the downstream chamber.

FIG. 4 is an illustration showing the photoresist stripping effect corresponding to the experiment using $O_2:N_2H_2$ as the processing gas in the downstream chamber 200. A cross-section 308 of the post ion implant photoresist material is shown after the $O_2:N_2H_2$ processing gas experiment. The cross-section 308 shows a remaining top photoresist crust 309 above a partially removed bulk photoresist portion 310. The side photoresist crust 303 (see FIG. 3) is completely removed during the experiment to expose the bulk photoresist portion 310 to the $O_2:N_2H_2$ processing gas radicals. The unacceptably low crust selectivity of 0.08 of the $O_2:N_2H_2$ processing gas causes significant undercut regions 311. The undercut regions 311 are undesirable because they leave the remaining top photoresist crust 309 susceptible to breaking off or falling onto the substrate material 307. If allowed to contact the substrate material 307, the remaining top photoresist crust 309 will adhere tenaciously to the substrate material 307 and create difficulties in completing the photoresist material stripping process.

As shown in Table 1, a downstream chamber 200 experiment is performed using an $O_2:N_2:CF_4$ processing gas mixture. Specifically, the processing gas mixture is composed of $O_2$ and $N_2$ mixed in a 9-to-1 ratio, respectively, with about 2000 parts per million by mass (ppm) $CF_4$ added. $CF_4$ is commonly used to remove tough residues and polymers. The experiment shows that a small amount of $CF_4$ greatly increases the bulk strip rate, but provides very little improvement with respect to the crust strip rate. Thus, the problem associated with the $O_2:N_2H_2$ processing gas of requiring an unacceptably long time to completely strip a typical photoresist crust thickness also applies to the $O_2:N_2:CF_4$ processing gas. Furthermore, the $O_2:N_2:CF_4$ processing gas bulk strip rate of 16000 Å/min results in a very low crust selectivity of 0.02.

Figure 5:
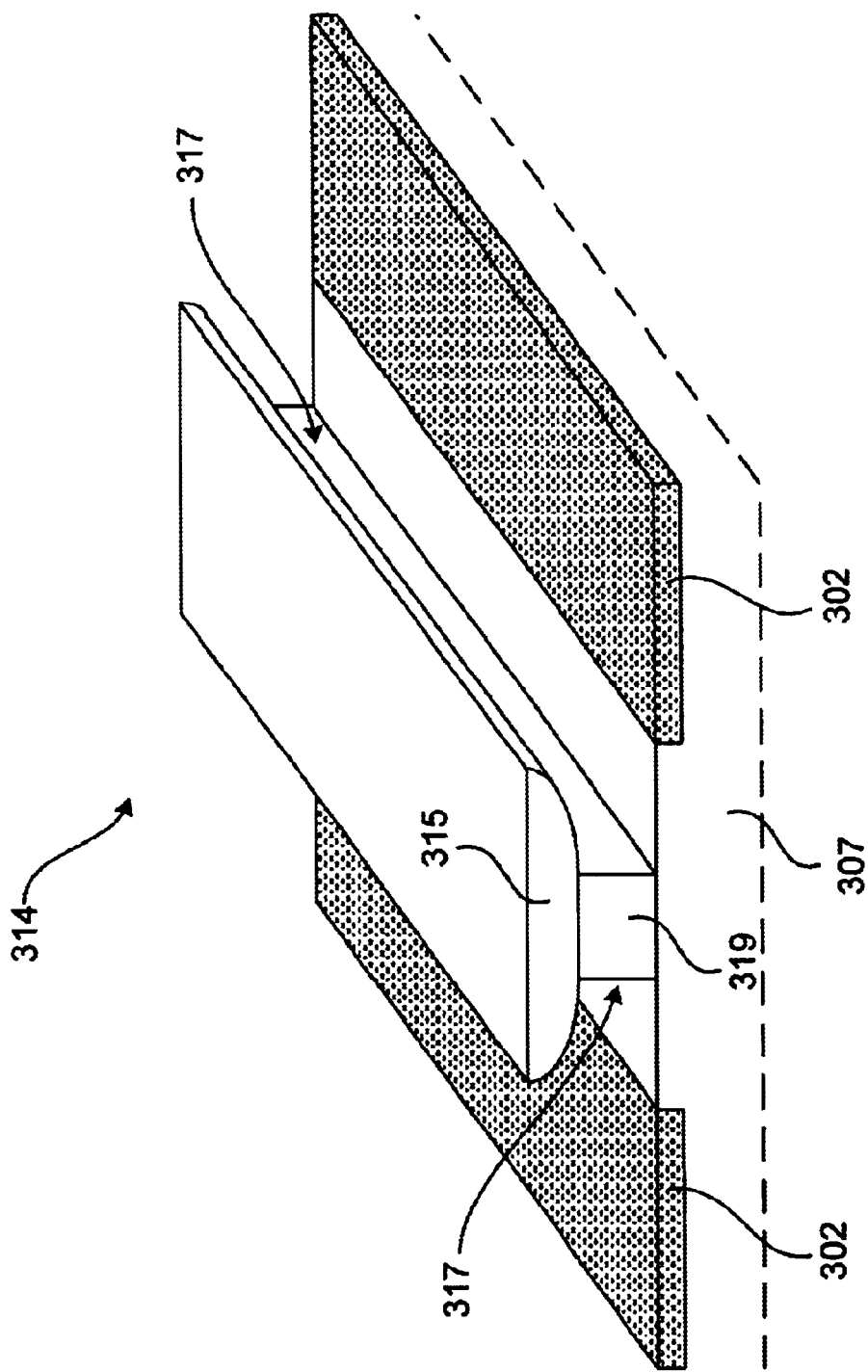
FIG. 5 is an illustration showing the photoresist stripping effect corresponding to the experiment using $O_2:N_2:CF_4$ as the processing gas in the downstream chamber.

FIG. 5 is an illustration showing the photoresist stripping effect corresponding to the experiment using $O_2:N_2:CF_4$ as the processing gas in the downstream chamber 200. A cross-section 314 of the post ion implant photoresist material is shown after the $O_2:N_2:CF_4$ processing gas experiment. The cross-section 314 shows a remaining top photoresist crust 315 above a partially removed bulk photoresist portion 319. The side photoresist crust 303 (see FIG. 3) is completely removed during the experiment to expose the bulk photoresist portion 319 to the $O_2:N_2:CF_4$ processing gas radicals. The extremely low crust selectivity of 0.02 of the $O_2:N_2:CF_4$ processing gas causes severe undercut regions 317. The undercut regions 317 are more pronounced than the analogous undercut regions 311 in the $O_2:N_2H_2$ processing gas experiment. As with the $O_2:N_2H_2$ experiment, the undercut regions 317 are undesirable because they leave the remaining top photoresist crust 315 susceptible to breaking off or falling onto the substrate material 307.

As shown in Table 1, a downstream chamber 200 experiment is performed using $NH_3$ (i.e., ammonia) as the processing gas. The $NH_3$ processing gas is used as a hydrogen source gas. The experiment shows that the $NH_3$ processing gas has a higher crust strip rate (563 Å/min) than either the $O_2:N_2H_2$ or the $O_2:N_2:CF_4$ processing gases. The $NH_3$ processing gas is also shown to have an acceptable crust selectivity of 0.3. Unfortunately, $NH_3$ is toxic and requires appropriate handling precautions.

Figure 6:
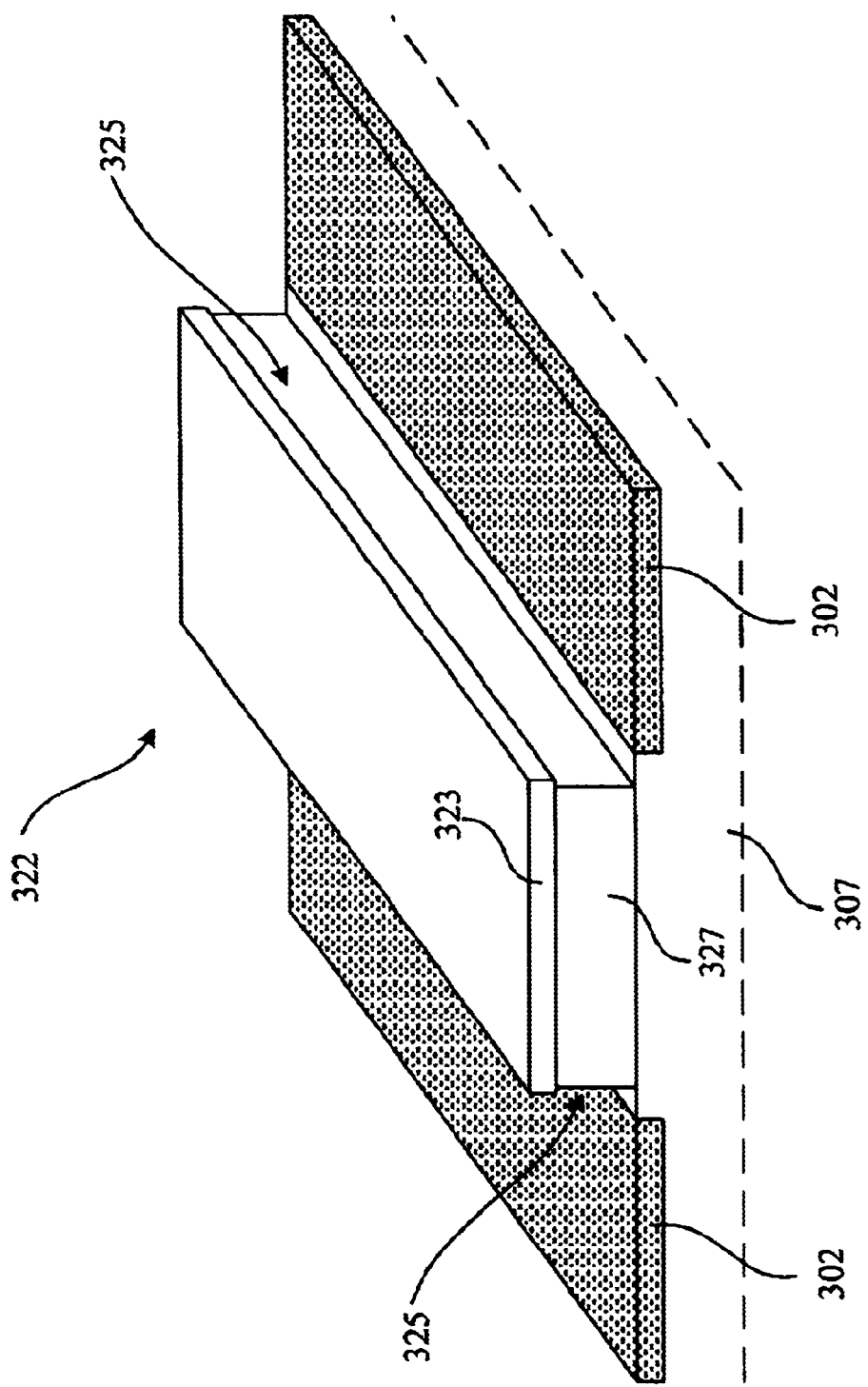
FIG. 6 is an illustration showing the photoresist stripping effect corresponding to the experiment using $NH_3$ as the processing gas in the downstream chamber.

FIG. 6 is an illustration showing the photoresist stripping effect corresponding to the experiment using $NH_3$ as the processing gas in the downstream chamber 200. A cross-section 322 of the post ion implant photoresist material is shown after the $NH_3$ processing gas experiment. The cross-section 322 shows a remaining top photoresist crust 323 above a remaining bulk photoresist portion 327. The remaining top photoresist crust 323 is noticeably thinned by the $NH_3$ processing gas experiment. Also, the side photoresist crust 303 (see FIG. 3) is completely removed during the experiment to expose the bulk photoresist portion 327 to the radicals. However, the remaining bulk photoresist portion 327 indicates only a slight undercut 325. The relatively small amount of undercut 325 is expected due to the acceptable crust selectivity of 0.3.

As shown in Table 1, a downstream chamber 200 experiment is performed using an $H_2O$ vapor as the processing gas. The $H_2O$ vapor is used as a hydrogen source gas. The experiment shows that of the four processing gases tested, $H_2O$ vapor provides the highest crust strip rate at 750 Å/min. The $H_2O$ vapor is also shown to have an acceptable crust selectivity of 0.2. Additionally, $H_2O$ vapor has the advantages of being non-toxic, safe (e.g., non-flammable), readily available, and inexpensive.

Figure 7:
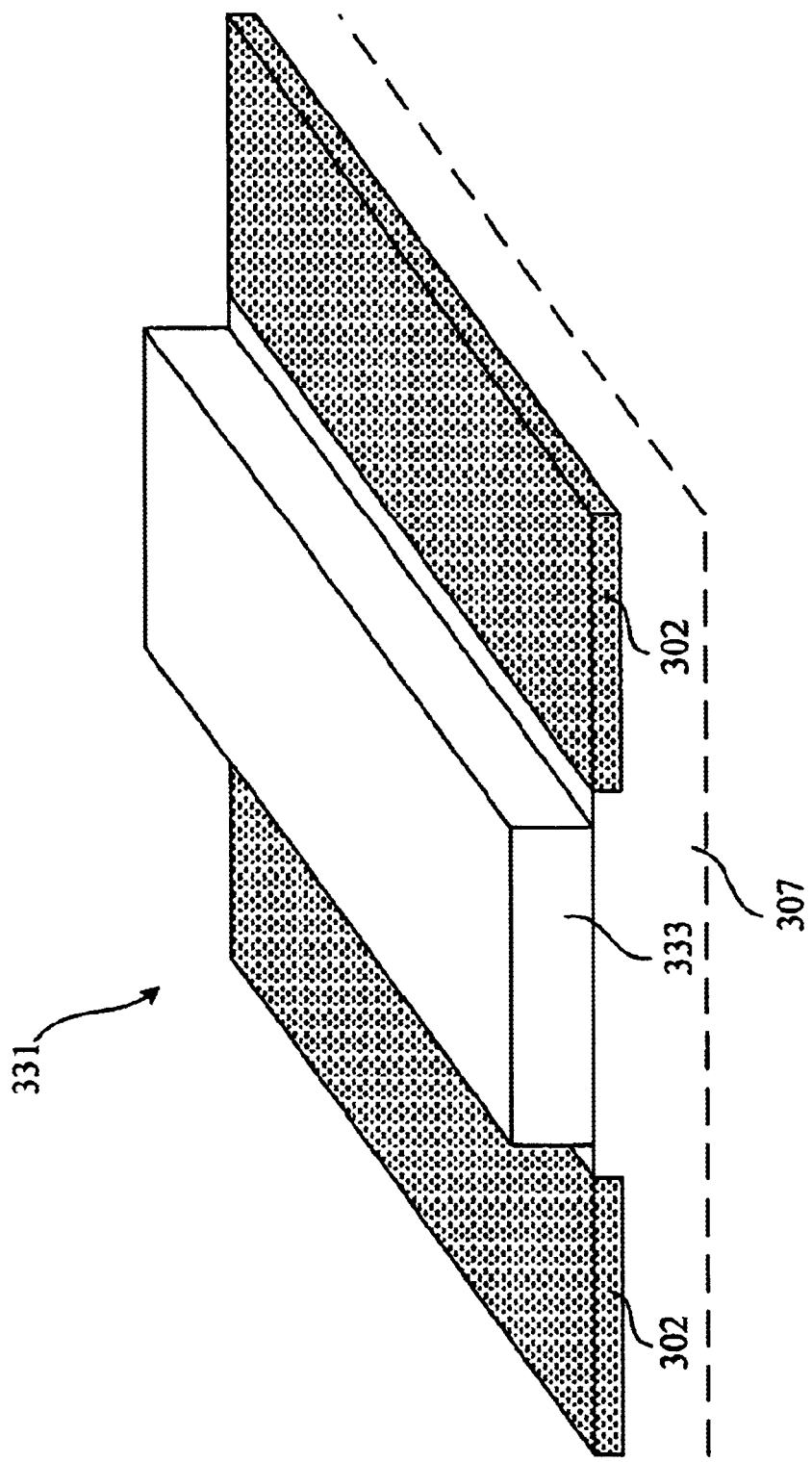
FIG. 7 is an illustration showing the photoresist stripping effect corresponding to the experiment using $H_2O$ vapor as the processing gas in the downstream chamber, in accordance with one embodiment of the present invention.

FIG. 7 is an illustration showing the photoresist stripping effect corresponding to the experiment using $H_2O$ vapor as the processing gas in the downstream chamber 200, in accordance with one embodiment of the present invention. A cross-section 331 of the post ion implant photoresist material is shown after the $H_2O$ vapor processing gas experiment. The cross-section 331 shows only a remaining bulk photoresist portion 333. Both the top photoresist crust 301 (see FIG. 3) and the side photoresist crust 303 (see FIG. 3) are completely removed during the experiment to expose the bulk photoresist portion 333 to the radicals. Due to the fast crust strip rate of 750 Å/min and the acceptable crust selectivity of 0.2, the bulk photoresist portion 333 does not show any indication of undercut.

The downstream chamber 200 experiments clearly demonstrate the usefulness of $H_2O$ vapor as a processing gas for stripping post ion implant photoresist material. However, it may be beneficial in some circumstances to have an even higher crust strip rate. As an alternative to the isotropic photoresist stripping technique implemented with the downstream chamber 200, a directionally biased stripping technique ("biased stripping") can be implemented with an inductively coupled plasma etching chamber ("etching chamber") 400. The biased stripping preferentially directs the ions to move in a direction substantially perpendicular to an upper surface of a chuck having a bias voltage. Therefore, the biased stripping causes the ions to contact the wafer top surface in a substantially perpendicular manner such that the photoresist top crust is preferentially stripped. The biased stripping should be performed carefully, however, to prevent undesirable etching of a substrate material which could cause defects in the integrated circuitry being fabricated on the wafer.

Figure 8:
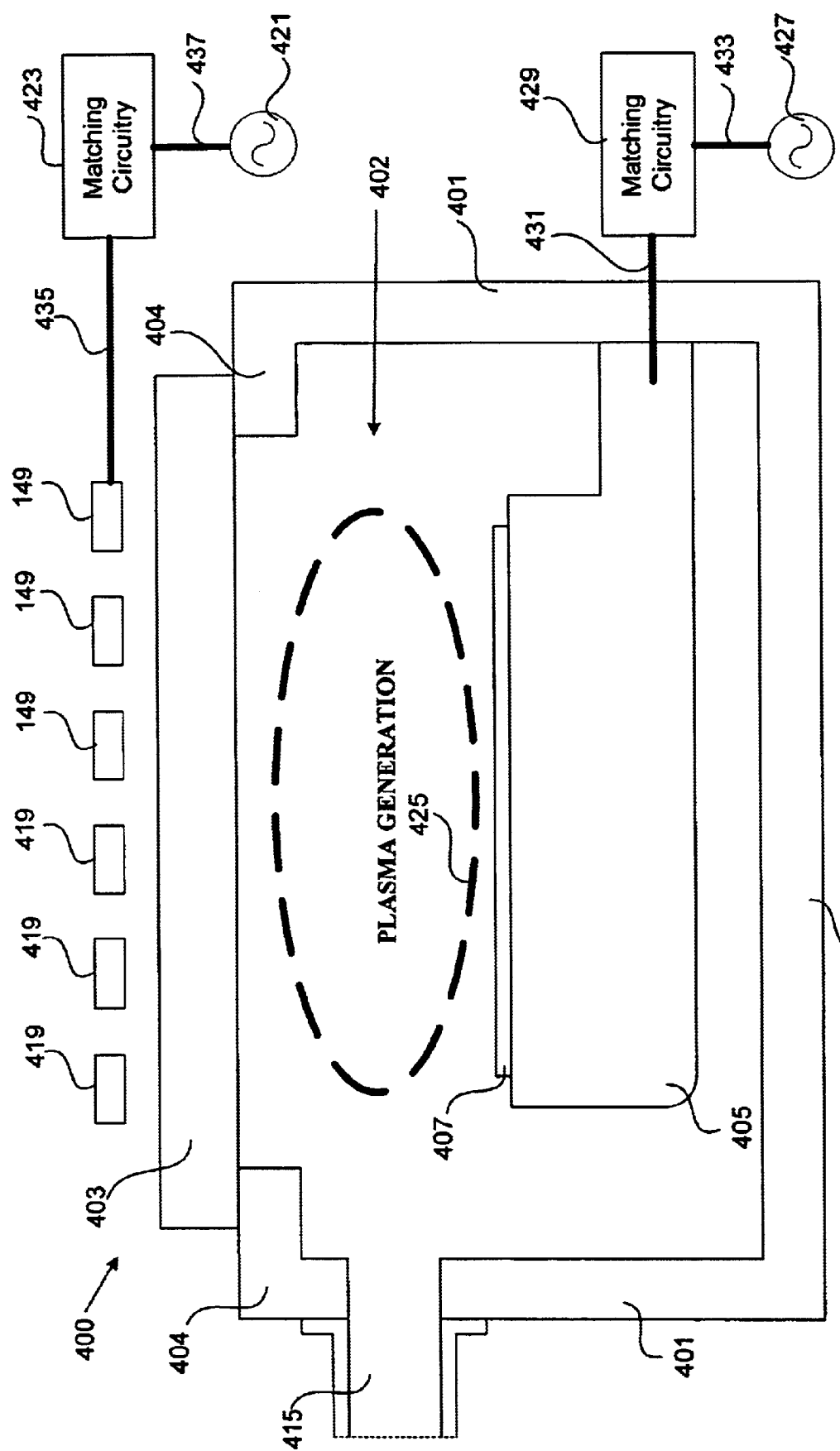
FIG. 8 is an illustration showing the etching chamber used to perform a biased photoresist stripping process, in accordance with one embodiment of the present invention.

FIG. 8 is an illustration showing the etching chamber 400 used to perform a biased photoresist stripping process, in accordance with one embodiment of the present invention. A chamber internal region 402 in defined by chamber walls 401, a chamber top 404, and a chamber bottom 406. The chamber top 404 is configured to have an opening to the chamber internal region 402. The opening in the chamber top 404 is covered by a window 403. A semiconductor wafer support structure (or "chuck") 405 is positioned within the chamber internal region 402 near the chamber bottom 406. The chuck 405 contains a number of lifting pins (not shown) that are used to raise and lower a semiconductor wafer (or "wafer") 407 placed on the chuck 405 for processing. The chuck 405 is further configured to receive a flow of fluid for controlling the temperature of the chuck 405. A processing gas supply line 415 is in fluid communication with the chamber internal region 402 to supply a processing gas. An electrically conductive coil 419 is configured above the window 403. A radio frequency power supply 421 is configured to supply radio frequency power to the coil 419. In general, the radio frequency power supply 421 is electrically connected to matching circuitry 423 through a connection 437. The matching circuitry 423 is in further electrical communication with the coil 419 through a connection 435. The radio frequency power supplied to the coil 419 is used to generate an electromagnetic field about the coil 419. The electromagnetic field induces an electric current within the chamber internal region 402. The induced electric current is used to transform the processing gas into a plasma 425 containing ions and radicals of its constituent elements. The chuck 405 is configured to receive a bias voltage. In general, a radio frequency power supply 427 is electrically connected to matching circuitry 429 through a connection 433. The matching circuitry 429 is in further electrical communication with the chuck 405 through a connection 431. In this manner, the radio frequency power supply 427 is used to provide the chuck 405 with the bias voltage. The bias voltage creates a voltage potential that is used to attract the plasma 425 ions to the wafer 407. The ions directionally (i.e., biased in direction toward the wafer 407 top surface) contact the wafer 407 and react to remove photoresist materials present on the wafer 407 surface. Also, the plasma 425 radicals isotropically (i.e., uniformly in direction) contact the wafer 407 and react to remove photoresist materials present on the wafer 407 surface.

In a preferred embodiment of the present invention, $H_2O$ vapor is used as the processing gas in the etching chamber 400 to strip the photoresist crust. In the preferred embodiment, a partial vacuum pressure of about 0.2 torr is provided in the chamber internal region 402. In alternate embodiments, the partial vacuum pressure can be provided within a range extending from about 0.001 torr to about 1 torr, but more preferably within a range extending from about 0.07 torr to about 0.5 torr. Also in the preferred embodiment, $H_2O$ vapor is supplied to the chamber internal region 402 at a flow rate of about 2000 std. cc/sec. In alternate embodiments, the $H_2O$ vapor can be supplied at a flow rate within a range extending from about 100 std. cc/sec to about 4000 std. cc/sec, but more preferably within a range extending from about 500 std. cc/sec to about 3000 std. cc/sec. The preferred embodiment further includes applying a radio frequency power of about 2.5 kW from the radio frequency power supply 421 to the coil 419 to induce the electric current in the chamber internal region 402 which will generate the plasma 425. In alternate embodiments, the radio frequency power can be applied within a range extending from about 0.5 kW to about 3 kW, but more preferably within a range extending from about 1.5 kW to about 3 kW. In the preferred embodiment, the chuck 405 temperature is controlled to maintain the wafer 407 temperature at about 70° C. In alternate embodiments, the wafer temperature can be maintained within a range extending from about 25° C. to about 130° C., but more preferably within a range extending from about 25° C. to about 100° C. The photoresist crust stripping rate increases with higher wafer 407 temperatures. However, it is necessary to maintain the wafer 407 temperature below about 130° C. to prevent the bulk photoresist portion from popping through the photoresist crust. The wafer 407 lifting pins contained within the chuck 405 can be either up or down during the biased photoresist stripping process. However, since the wafer 407 temperature is primarily controlled by heat transfer from the chuck 405, it is preferable to have the lifting pins down during the biased photoresist stripping process, thus placing the wafer 407 in closer proximity to the chuck 405. The preferred embodiment further includes applying a radio frequency power of about 250 W from the radio frequency power supply 427 to the chuck 405. The radio frequency power provides the chuck 405 with a bias voltage creating a voltage potential that causes the ions to be attracted toward the chuck 405 and wafer 407. In alternate embodiments, the radio frequency power can be applied within a range extending from about 0 W to about 800 W, but more preferably within a range extending from about 0 W to about 600 W.

The usefulness of the present invention is demonstrated through a series of experiments. In the series of experiments, the post ion implant photoresist stripping effectiveness of a number of different processing gas chemistries are tested in the etching chamber 400. The principle experimental parameters include processing gas chemistry, chamber internal region 402 pressure, radio frequency power applied to the coil 419 ("coil power"), radio frequency power applied to the chuck 405 ("chuck power"), processing gas flow rate, wafer 407 temperature, and stripping process duration. Table 3 shows a summary of the principle experimental parameters for each of the tested processing gas chemistries. The experimental results are characterized in terms of photoresist crust strip rate ("crust strip rate") and rate of substrate loss due to etching ("substrate etch rate"). Table 4 shows a summary of the etching chamber 400 experimental results corresponding to the principle experimental parameters presented in Table 3.

TABLE 3

Summary of Principle Parameters for the Etching Chamber Experiments

| Processing Gas Chemistry | Chamber Internal Pressure (torr) | Coil Power (W) | Chuck Power (W) | Processing Gas Flow Rate (std. cc/sec) | Wafer Temperature (C.) | Stripping Process Duration (sec) |
|---|---|---|---|---|---|---|
| $O_2$ | 0.09 | 750 | 250 | 200 $O_2$ | 60 | 40 |
| $O_2:Cl_2$ | 0.09 | 750 | 100 | 200 $O_2$ 100 $Cl_2$ | 75 | 240 |
| $O_2:CF_4$ | 0.09 | 750 | 100 | 200 $O_2$ 5 $CF_4$ | 75 | 110 |
| $H_2O$ | 0.09 | 750 | 250 | 900 $H_2O$ | 60 | 40 |

TABLE 4

Summary of Results for the Etching Chamber Experiments

| Processing Gas Chemistry | Photoresist Profile Description After Stripping | Crust Strip Rate (Å/min) | Substrate Etch Rate (Å/min) |
|---|---|---|---|
| $O_2$ | Top crust gone; Side crust remaining; No noticeable substrate loss | 2250 | 0 |
| $O_2:Cl_2$ | Top crust gone; Side crust gone; No noticeable substrate loss | 530 | not available |
| $O_2:CF_4$ | Top crust gone; Side crust gone; Very noticeable substrate loss | 1500 | 150 |
| $H_2O$ | Top crust gone; Side crust remaining; Very little substrate loss | 3000 | 8 |

As shown in Table 3, an etching chamber 400 experiment is performed using $O_2$ as the processing gas. The $O_2$ processing gas provides a crust strip rate of 2250 Å/min. Also, use of the $O_2$ processing gas does not cause etching of the substrate material.

Figure 9:
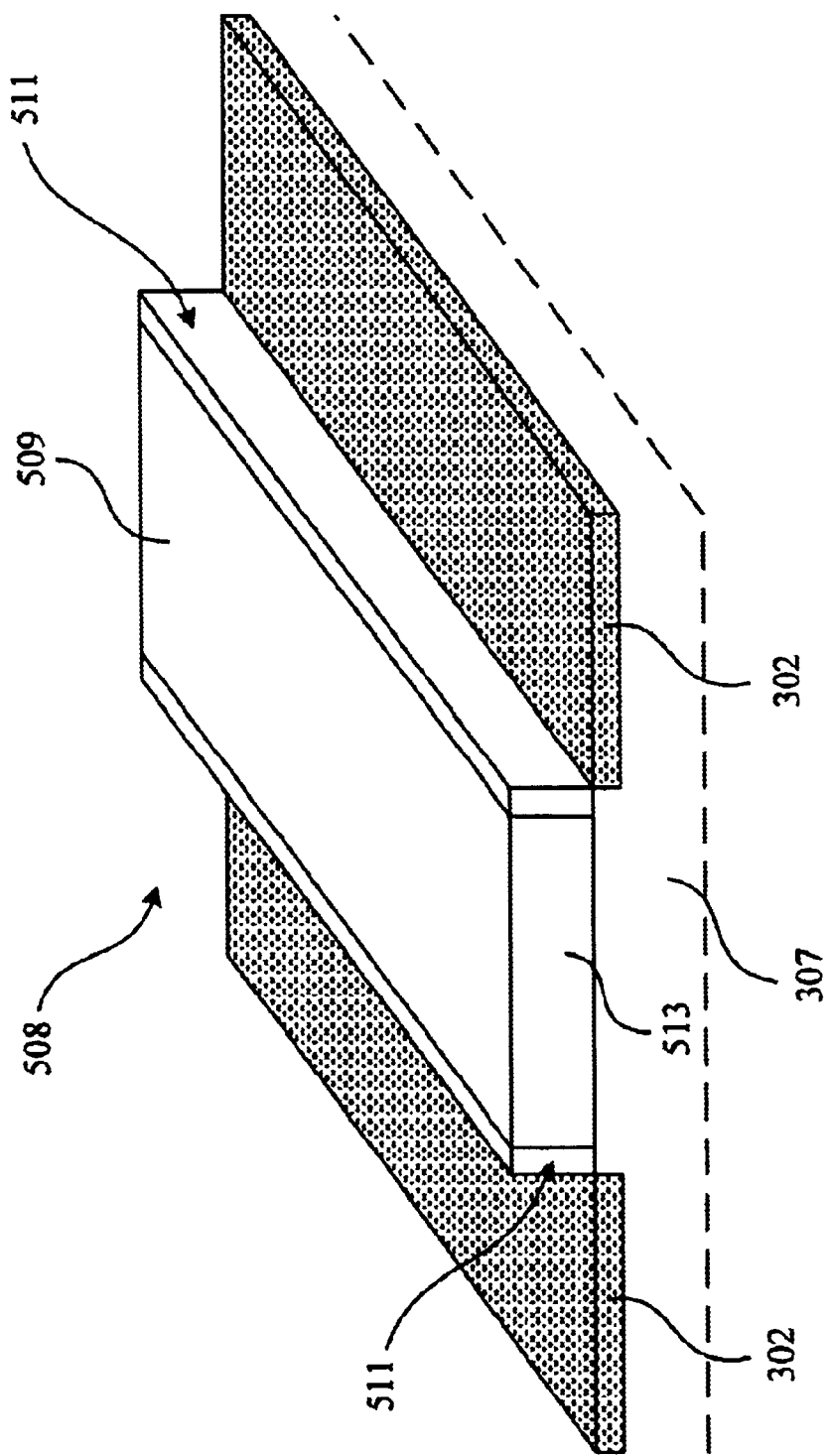
FIG. 9 is an illustration showing the photoresist stripping effect corresponding to the experiment using $O_2$ as the processing gas in the etching chamber.

FIG. 9 is an illustration showing the photoresist stripping effect corresponding to the experiment using $O_2$ as the processing gas in the etching chamber 400. A cross-section 508 of the post ion implant photoresist material is shown after the $O_2$ processing gas experiment. The cross-section 508 shows the top photoresist crust 301 (see FIG. 3) removed from a remaining bulk photoresist portion 513. The remaining bulk photoresist portion 513 is bordered by remaining side photoresist crust sections 511 having approximately the same height as the remaining bulk photoresist portion 513.

As shown in Table 3, an etching chamber 400 experiment is performed using an $O_2:Cl_2$ processing gas mixture. Specifically, the processing gas mixture is composed of $O_2$ and $Cl_2$ mixed in a 2-to-1 ratio, respectively. One problem associated with the $O_2:Cl_2$ processing gas is that it takes an unacceptably long time to completely strip a typical photoresist crust thickness. Table 3 shows that of the four processing gas chemistries tested, $O_2:Cl_2$ has the lowest crust strip rate at 530 Å/min.

Figure 10:
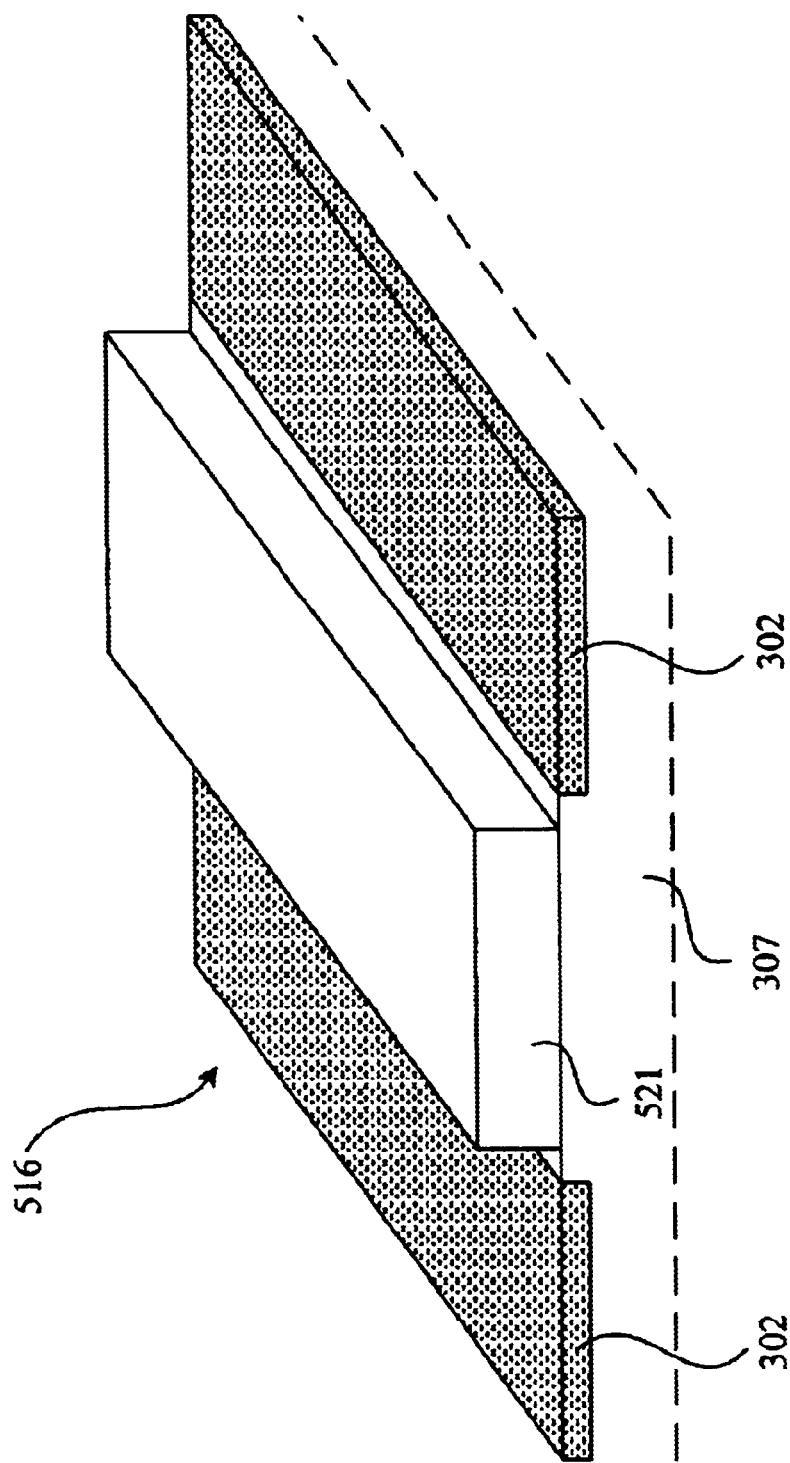
FIG. 10 is an illustration showing the photoresist stripping effect corresponding to the experiment using $O_2:Cl_2$ as the processing gas in the etching chamber.

FIG. 10 is an illustration showing the photoresist stripping effect corresponding to the experiment using $O_2:Cl_2$ as the processing gas in the etching chamber 400. A cross-section 516 of the post ion implant photoresist material is shown after the $O_2:Cl_2$ processing gas experiment. The cross-section 516 shows the top photoresist crust 301 (see FIG. 3) and the side photoresist crust 303 (see FIG. 3) removed from a remaining bulk photoresist portion 521.

As shown in Table 3, an etching chamber 400 experiment is performed using an $O_2:CF_4$ processing gas mixture. Specifically, the processing gas mixture is composed of $O_2$ and $CF_4$ mixed in a 40-to-1 ratio, respectively. Use of the $O_2:CF_4$ processing gas provides a crust strip rate of 1500 Å/min. However, use of the relatively small amount of $CF_4$ in the $O_2:CF_4$ processing gas results in an unacceptable substrate etch rate of 150 Å/min.

Figure 11:
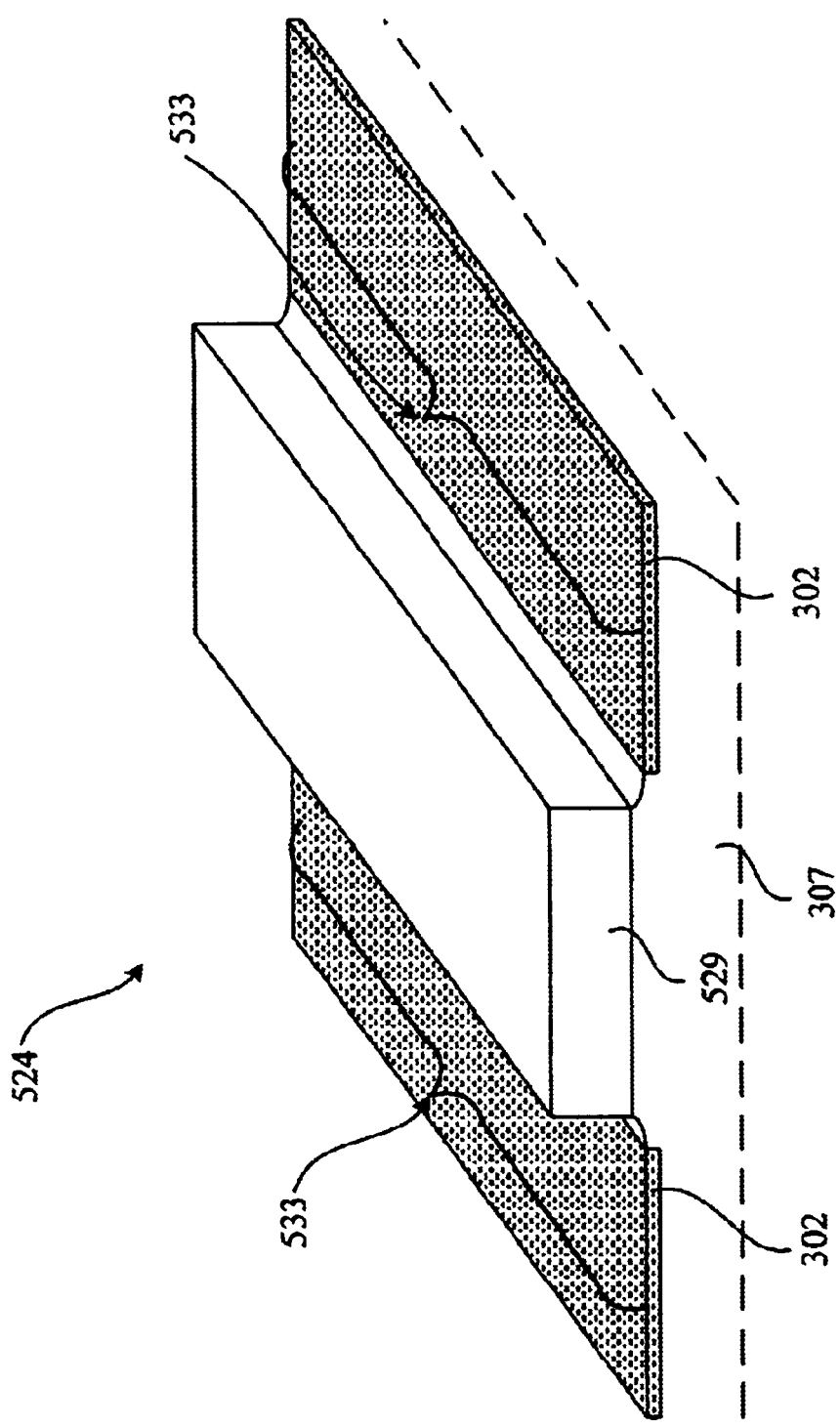
FIG. 11 is an illustration showing the photoresist stripping effect corresponding to the experiment using $O_2:CF_4$ as the processing gas in the etching chamber.

FIG. 11 is an illustration showing the photoresist stripping effect corresponding to the experiment using $O_2:CF_4$ as the processing gas in the etching chamber 400. A cross-section 524 of the post ion implant photoresist material is shown after the $O_2:CF_4$ processing gas experiment. The cross-section 524 shows the top photoresist crust 301 (see FIG. 3) and the side photoresist crust 303 (see FIG. 3) removed from a remaining bulk photoresist portion 529. Additionally, the substrate material 307 is shown to be unacceptably etched as indicated by areas 533.

As shown in Table 3, an etching chamber 400 experiment is performed using an $H_2O$ vapor as the processing gas. The $H_2O$ vapor is used as a hydrogen source gas. The experiment shows that of the four processing gases tested, $H_2O$ vapor provides the highest crust strip rate at 3000 Å/min. The $H_2O$ vapor is also shown to have an acceptably low substrate etch rate of 8 Å/min. In the preferred embodiment of the present invention, there is essentially no etching of the substrate material. Additionally, $H_2O$ vapor has the advantages of being non-toxic, safe (e g., non-flammable), readily available, and inexpensive.

Figure 12:
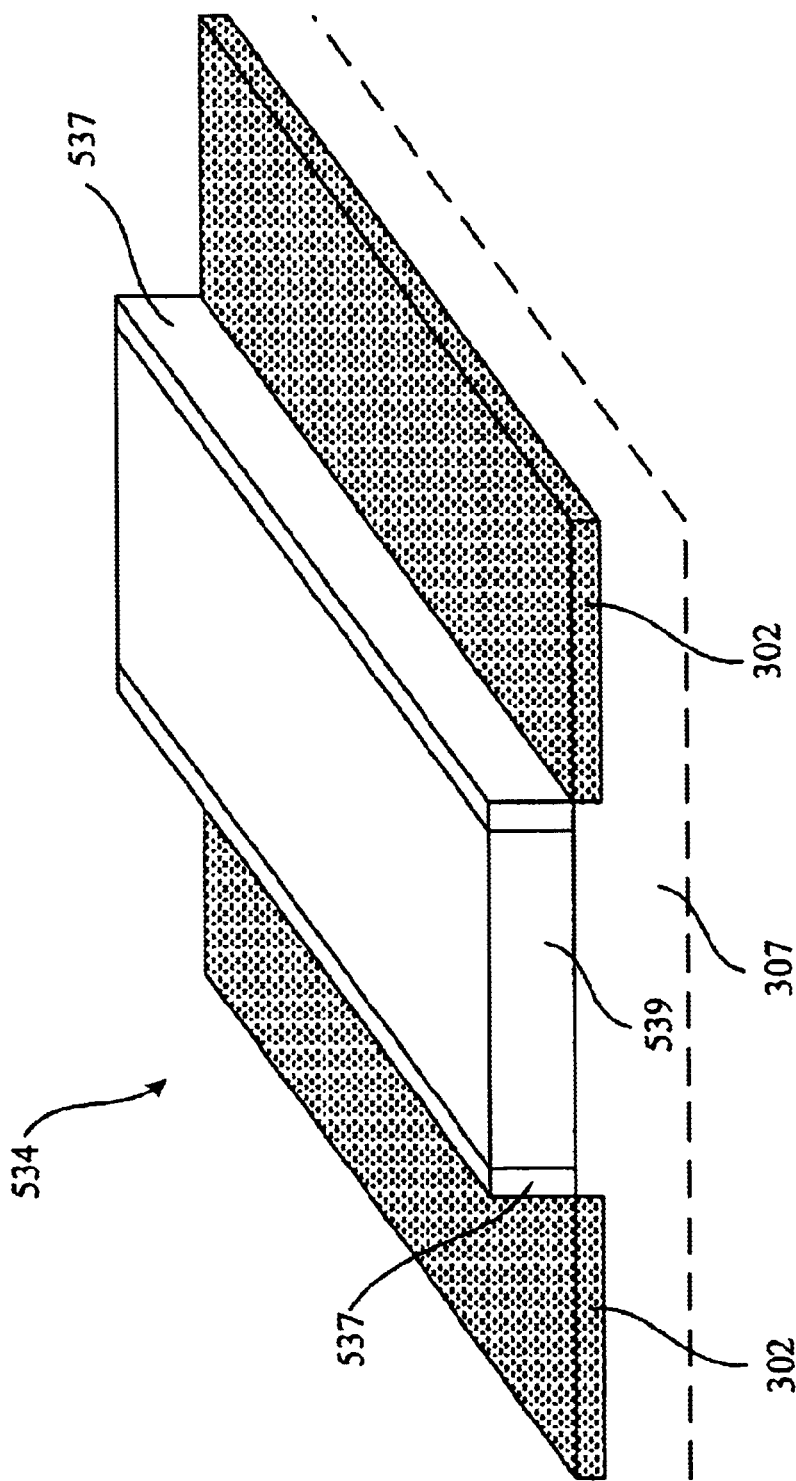
FIG. 12 is an illustration showing the photoresist stripping effect corresponding to the experiment using $H_2O$ vapor as the processing gas in the etching chamber, in accordance with one embodiment of the present invention.

FIG. 12 is an illustration showing the photoresist stripping effect corresponding to the experiment using $H_2O$ vapor as the processing gas in the etching chamber 400, in accordance with one embodiment of the present invention. A cross-section 534 of the post ion implant photoresist material is shown after the $H_2O$ vapor processing gas experiment. The cross-section 534 shows the top photoresist crust 301 (see FIG. 3) removed from a remaining bulk photoresist portion 539. The remaining bulk photoresist portion 539 is bordered by remaining side photoresist crust sections 537 having approximately the same height as the remaining bulk photoresist portion 539.

The etching chamber 400 experiments clearly demonstrate the usefulness of $H_2O$ vapor as a processing gas for accelerated stripping of post ion implant photoresist material. Thus, use of $H_2O$ vapor as the processing gas in both the downstream chamber 200 and the etching chamber 400 provides for efficient photoresist crust stripping without the popping and undercut problems of the prior art. The $H_2O$ vapor is also effective for stripping photoresist material in both the downstream chamber 200 and the etching chamber 400 when combined with other processing gases such as $O_2$ or $N_2$.

Figure 13:
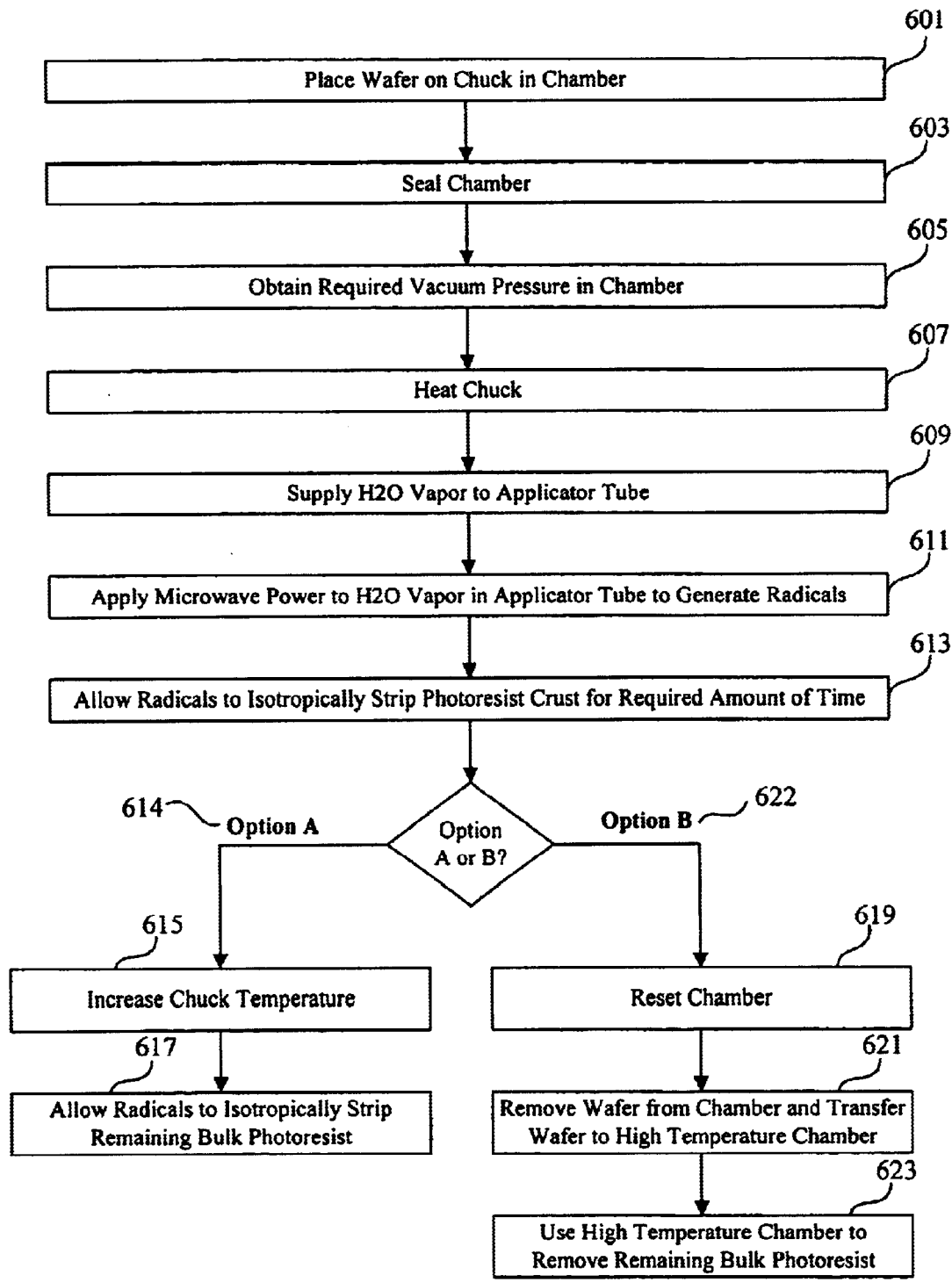
FIG. 13 is an illustration showing a flowchart of the method for performing a photoresist stripping process using $H_2O$ vapor in the downstream chamber, in accordance with one embodiment of the present invention.

FIG. 13 is an illustration showing a flowchart of the method for performing a photoresist stripping process using $H_2O$ vapor in the downstream chamber 200, in accordance with one embodiment of the present invention. The method begins with a step 601 wherein the wafer 221 is placed on the chuck 217 in the downstream chamber 200. In a step 603, the downstream chamber 200 is sealed. A step 605 requires the necessary partial vacuum pressure to be obtained within the downstream chamber 200. A step 607 requires the chuck 217 to be heated to obtain the appropriate wafer 221 temperature for the photoresist crust stripping process. In a step 609, the appropriate flow rate of $H_2O$ vapor is supplied as the processing gas to the applicator tube 203. A step 611 follows in which the required microwave power is supplied from the microwave power supply 205 to the $H_2O$ vapor processing gas in the applicator tube 203. The microwave power causes the $H_2O$ vapor to be transformed into H radicals and O radicals. In a step 613, the H radicals and O radicals flow to the wafer 221 surface. The H radicals and O radicals contact the wafer 221 surface in an isotropic manner to react with the photoresist materials on the wafer 221 surface. The H radicals and the O radicals are allowed to react with the photoresist materials on the wafer 221 surface until the photoresist crust is removed. After removal of the photoresist crust, the remaining bulk photoresist portion can be removed by either an Option A 614 or an Option B 622. Option A 614 includes a step 615 in which the temperature of the chuck 217 is increased substantially. Under Option A 614, a step 617 follows in which the H radicals and the O radicals are allowed to continue to react with the remaining bulk photoresist material while the increased temperature assists in removing the remaining bulk photoresist material through volatilization. Option B 622 begins with a step 619 in which the downstream chamber 200 is reset to its initial state prior to the photoresist stripping process. Option B 622, then continues with a step 621 in which the wafer 221 is removed from the downstream chamber 200. Under Option B 622, the method concludes with a step 623 in which the wafer 221 is transferred to a high temperature chamber where the remaining bulk photoresist material is exposed to high temperature (e.g., 200° C. to 300° C.). The high temperature removes the remaining bulk photoresist material through volatilization.

Figure 14:
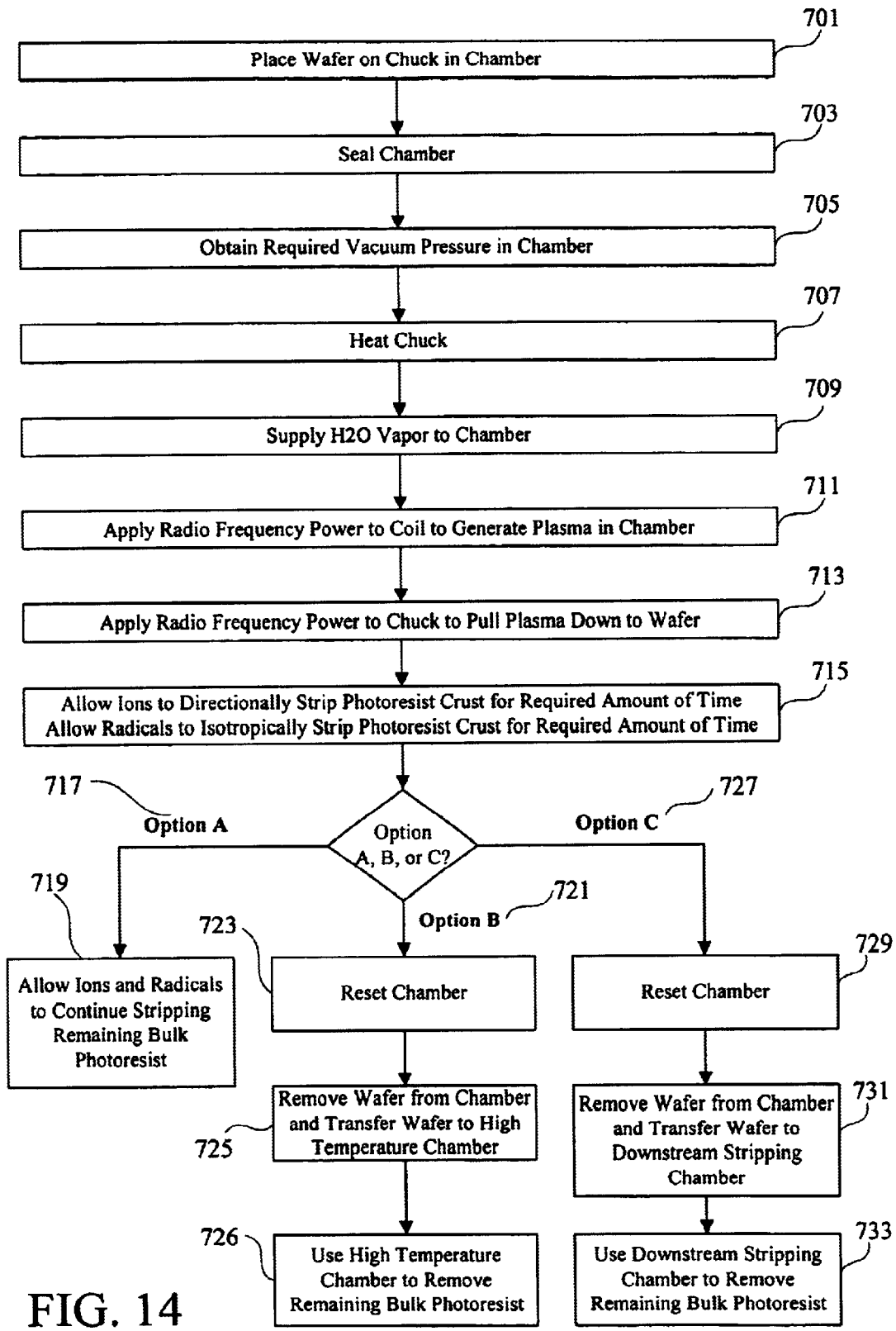
FIG. 14 is an illustration showing a flowchart of the method for performing a biased photoresist stripping process using $H_2O$ vapor in the etching chamber, in accordance with one embodiment of the present invention.

FIG. 14 is an illustration showing a flowchart of the method for performing a biased photoresist stripping process using $H_2O$ vapor in the etching chamber 400, in accordance with one embodiment of the present invention. The method begins with a step 701 in which the wafer 407 is placed on the chuck 405 in the etching chamber 400. In a step 703, the etching chamber 400 is sealed. A step 705 requires the necessary partial vacuum pressure to be obtained within the etching chamber 400. A step 707 requires the chuck 405 to be heated to obtain the appropriate wafer 407 temperature for the photoresist crust stripping process. In a step 709, the appropriate flow rate of $H_2O$ vapor is supplied as the processing gas to the chamber internal region 402. A step 711 follows in which the required radio frequency power is applied from the radio frequency power supply 421 to the coil 419. The radio frequency power causes the coil 419 to induce an electric current in the chamber internal region 402. The electric current in the chamber internal region 402 causes the $H_2O$ vapor processing gas to be transformed into H ions, H radicals, O ions, and O radicals. In a step 713, radio frequency power is applied from the radio frequency power supply 427 to the chuck 405 to provide bias voltage to the chuck 405. The voltage potential created by the bias voltage applied to the chuck 405 attracts the H ions and the O ions to the wafer 407. In a step 715, the H ions and the O ions are allowed to directionally (i.e., biased in direction toward the wafer 407 top surface) contact the wafer 407 and react to remove the photoresist material present on the wafer 407 surface. Also in step 715, the H radicals and the O radicals are allowed to isotropically contact the wafer 407 and react to remove the photoresist material present on the wafer 407 surface. Due to the directionality of the H ions and the O ions, the photoresist material is preferentially removed in a top-to-bottom manner. After removal of the top photoresist crust, the remaining side photoresist crust and bulk photoresist portion can be removed by either an Option A 717, an Option B 721, or an Option C 727. Option A 717 concludes the method with a step 719 in which the H ions, the H radicals, the O ions, and the O radicals are allowed to continue to react with the remaining side photoresist crust and bulk photoresist portion until the photoresist material is completely removed from the wafer 407. Option B 721 includes a step 723 in which the etching chamber 400 is reset to its initial state prior to the photoresist stripping process. Under Option B 721, the method continues with a step 725 in which the wafer 407 is transferred from the etching chamber 400 to a high temperature chamber. Option B 721 concludes with a step 726 in which the high temperature chamber is used to remove the remaining photoresist materials through volatilization. Option C 727 includes a step 729 in which the etching chamber 400 is reset to its initial state prior to the photoresist stripping process. Under Option C 727, the method continues with a step 731 in which the wafer 407 is transferred from the etching chamber 400 to the downstream chamber 200. Option C 727 concludes with a step 733 in which the remaining photoresist materials are removed using the downstream chamber 200.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for stripping photoresist material from a substrate in a chamber, comprising:

providing a substrate having a patterned photoresist layer, the patterned photoresist layer being previously used as an ion implantation mask such that a photoresist crust is formed on an outer surface of the patterned photoresist layer, the patterned photoresist layer thus being defined by a bulk photoresist portion and the photoresist crust, the substrate being placed in the chamber;

heating the substrate in the chamber;

providing a processing gas including $H_2O$ vapor; and applying microwave power to the processing gas, the microwave power causing the processing gas to be transformed into a reactive form of H and a reactive form of O, wherein the reactive forms of H and O react with the photoresist crust, the reaction with the photoresist crust acting to remove the photoresist crust from the bulk photoresist portion of the patterned photoresist layer.

2. A method for stripping photoresist material from a substrate in a chamber as recited in claim 1, wherein the substrate is heated to a temperature within a range extending from about 25° C. to about 130° C.

3. A method for stripping photoresist material from a substrate in a chamber as recited in claim 1, further comprising:
generating a partial vacuum pressure within the chamber, the partial vacuum pressure being within a range extending from about 0.001 torr to about 5 torr.

4. A method for stripping photoresist material from a substrate in a chamber as recited in claim 1, wherein the processing gas is provided at a flow rate within a range extending from about 100 standard cubic centimeters per second (std. cc/sec) to about 4000 std. cc/sec.

5. A method for stripping photoresist material from a substrate in a chamber as recited in claim 1, wherein the microwave power is applied within a power range extending from about 500 Watts to about 5000 Watts.

6. A method for stripping photoresist material from a substrate in a chamber as recited in claim 1, wherein the processing gas is provided as a multiple gas mixture.

7. A method for stripping photoresist material from a substrate in a chamber as recited in claim 1, wherein the $H_2O$ vapor is included in the processing gas to remove both the photoresist crust and the bulk photoresist portion of the patterned photoresist layer.

8. A method for stripping photoresist material from a substrate in a chamber as recited in claim 1, further comprising:
detecting the removal of the photoresist crust; and
increasing the temperature of the substrate after removal of the photoresist crust, the temperature being increased within a range extending from about 130° C. to about 300° C., the increased temperature being maintained during removal of the bulk photoresist portion of the patterned photoresist layer.

9. A method for stripping photoresist material from a substrate in a chamber, the substrate having a patterned photoresist layer, the patterned photoresist layer being previously used as an ion implantation mask such that a photoresist crust is formed on an outer surface of the patterned photoresist layer, the patterned photoresist layer thus being defined by a bulk photoresist portion and the photoresist crust, the substrate being placed on a chuck in the chamber; the method comprising:
providing $H_2O$ vapor to an applicator tube;
applying microwave power to the $H_2O$ vapor in the applicator tube, the $H_2O$ vapor being transformed into H radicals and O radicals; and
flowing the H radicals and the O radicals from the applicator tube to the substrate, wherein the H radicals and the O radicals react with the photoresist crust, the reaction with the photoresist crust acting to remove the photoresist crust from the bulk photoresist portion of the patterned photoresist layer.

10. A method for stripping photoresist material from a substrate in a chamber as recited in claim 9, further comprising:
heating the chuck to increase the temperature of the substrate within a range extending from about 25° C. to about 130° C.

11. A method for stripping photoresist material from a substrate in a chamber as recited in claim 9, further comprising:
detecting the removal of the photoresist crust; and
heating the chuck to increase the temperature of the substrate after removal of the photoresist crust, the temperature being increased within a range extending from about 130° C. to about 300° C., the increased temperature being maintained during removal of the bulk photoresist portion of the patterned photoresist layer.

12. A method for stripping photoresist material from a substrate in a chamber as recited in claim 9, further comprising:
generating a partial vacuum pressure within the chamber, the partial vacuum pressure being within a range extending from about 0.5 torr to about 5 torr.

13. A method for stripping photoresist material from a substrate in a chamber as recited in claim 9, wherein the $H_2O$ vapor is provided to the applicator tube at a flow rate within a range extending from about 100 standard cubic centimeters per second (std. cc/sec) to about 4000 std. cc/sec.

14. A method for stripping photoresist material from a substrate in a chamber as recited in claim 9, wherein the microwave power is provided within a range extending from about 500 Watts to about 5000 Watts.

15. A method for stripping photoresist material from a substrate in a chamber as recited in claim 9, wherein the $H_2O$ vapor is provided as a component of a multiple gas mixture.

16. A method for stripping photoresist material from a substrate in a chamber as recited in claim 9, wherein the $H_2O$ vapor is provided to remove both the photoresist crust and the bulk photoresist portion of the patterned photoresist layer.

17. A method for stripping photoresist material from a substrate in a chamber, the substrate having a patterned photoresist layer, the patterned photoresist layer being previously used as an ion implantation mask such that a photoresist crust is formed on an outer surface of the patterned photoresist layer, the patterned photoresist layer thus being defined by a bulk photoresist portion and the photoresist crust, the substrate being placed on a chuck in the chamber; the method comprising:
providing $H_2O$ vapor to the chamber;
applying microwave power to the $H_2O$ vapor, the $H_2O$ vapor being transformed into a plasma containing H ions, H radicals, O ions, and O radicals; and applying a bias voltage to the chuck to attract the H ions and O ions to the substrate, wherein the H ions and the O ions react with the photoresist crust, the reaction with the photoresist crust acting to remove the photoresist crust from the bulk photoresist portion of the patterned photoresist layer.

18. A method for stripping photoresist material from a substrate in a chamber as recited in claim 17, further comprising:
heating the chuck to increase the temperature of the substrate within a range extending from about 25° C. to about 130° C.

19. A method for stripping photoresist material from a substrate in a chamber as recited in claim 17, further comprising:
generating a partial vacuum pressure within the chamber, the partial vacuum pressure being within a range extending from about 0.001 torr to about 1 torr.

20. A method for stripping photoresist material from a substrate in a chamber as recited in claim 17, wherein the $H_2O$ vapor is provided to the chamber at a flow rate within a range extending from about 100 standard cubic centimeters per second (std. cc/sec) to about 4000 std. cc/sec.

21. A method for stripping photoresist material from a substrate in a chamber as recited in claim 17, wherein the microwave power is provided within a range extending from about 500 Watts to about 5000 Watts.

22. A method for stripping photoresist material from a substrate in a chamber as recited in claim 17, wherein the bias voltage being applied to the chuck is applied using radio frequency power within a range extending from about 0 Watts to about 800 Watts.

23. A method for stripping photoresist material from a substrate in a chamber as recited in claim 17, wherein the $H_2O$ vapor is provided as a component of a multiple gas mixture.

24. A method for stripping photoresist material from a substrate in a chamber as recited in claim 17, further comprising:

detecting the removal of the photoresist crust; and providing $H_2O$ vapor to the chamber to remove the bulk photoresist portion of the patterned photoresist layer.

25. A method for removing photoresist material from a substrate, comprising:

supplying a processing gas including $H_2O$ vapor;

applying microwave power to the processing gas to generate reactive forms of H and O;

exposing the substrate to the reactive forms of H and O; and allowing the reactive forms of H and O to remove the photoresist material from the substrate, wherein the photoresist material includes a photoresist crust portion having been formed by ion implantation.

* * * * *